United States Patent [19]
Jeng et al.

[11] Patent Number: 5,282,925
[45] Date of Patent: Feb. 1, 1994

[54] DEVICE AND METHOD FOR ACCURATE ETCHING AND REMOVAL OF THIN FILM

[75] Inventors: Shwu-Jen Jeng; Wesley C. Natzle, both of Wappingers Falls; Chienfan Yu, Highland Mills, all of N.Y.

[73] Assignee: International Business Machines Corporation, Armonk, N.Y.

[21] Appl. No.: 973,380

[22] Filed: Nov. 9, 1992

[51] Int. Cl.$^5$ .................. B44C 1/22; C03C 15/00; C03C 25/06
[52] U.S. Cl. .................. 156/646; 134/031; 156/626; 156/628; 156/635; 156/657; 156/345
[58] Field of Search ........... 156/626, 628, 635, 643, 156/646, 655, 657, 667, 345; 134/1,30,31

[56] References Cited

U.S. PATENT DOCUMENTS

| | | | |
|---|---|---|---|
| 4,264,374 | 4/1981 | Beyer et al. | 134/3 |
| 4,678,536 | 7/1987 | Murayama et al. | 156/635 |
| 5,002,631 | 3/1991 | Giapis et al. | 156/643 |
| 5,030,319 | 7/1991 | Nishino et al. | 156/635 |
| 5,167,761 | 12/1992 | Westendrop et al. | 156/646 |
| 5,181,985 | 1/1993 | Lampert et al. | 156/635 |

FOREIGN PATENT DOCUMENTS 62-143428 6/1987 Japan .................. H01L 21/302

OTHER PUBLICATIONS

Vapor Phase Wafer Cleaning: Processing for the 1990s, B. E. Deal, et al., Jul. 1990, Solid State Technology, pp. 73–77.

Anhydrous HF Etching of NativeSiO$_2$: Applications to Device Fabrication, Richard E. Novak, Mar. 1988, Solid State Technology, pp. 39–41.

Proceedings of Symposium on Dry Process, Oct. 30–31, 1989, Tokyo, Nishimo, et al., Damage-Free Selective Etching of Si Native Oxide Employing Fluorine Atoms and Nitrogen Hydrides Produced by NH$_3$+NF$_3$ Microwave Discharge, pp. 90–93.

Physical Chemistry, 3rd Ed., Daniels & Alberty (Book, 1966, published by John Wiley, New York, pp. 148–150.

IBM Technical Disclosure Bulletin, vol. 19, No. 7, Dec. 1976, Etching of SiO$_2$ In Gaseous HF/H$_2$O, pp. 2513, Beyer et al.

*Primary Examiner*—William A. Powell
*Attorney, Agent, or Firm*—Whitham & Marhoefer

[57] ABSTRACT

New device and method are described for accurate etching and removal of thin layer by controlling the surface residence time, thickness and composition of reactant containing film. Etching of silicon dioxide at low pressure using a quartz crystal microbalance is illustrated. Usefulness of the invention in the manufacture of microelectronic devices is shown.

48 Claims, 13 Drawing Sheets

BENZENE-TOLUENE BOILING POINTS; LIQUID AND VAPOR COMPOSITIONS.

DEVICE AND METHOD FOR ACCURATE ETCHING AND REMOVAL OF THIN FILM

The present invention is generally related to the etching or removal of thin layers of material on a substrate, such as in semiconductor structures or microelectronic devices. More particularly this invention is related to an apparatus and method for removal of an accurate amount of a thin layer using means for controlling the surface residence time, composition, and thickness of film formed on the surface of thin layer to be etched.

BACKGROUND

Aqueous solutions of etchants have long been used to remove thin films from substrates. However, there are a number of disadvantages of wet etching techniques. These disadvantages are especially apparent in the semiconductor industry where wet cleans and etches contribute to particulate and other contamination. Therefore, processes that use gaseous etchants are preferred.

Another undesirable feature of both wet and gaseous etches is that generally the etching is isotropic, and a controlled source of etchant designed for removal of thin layers is not used. Often, only a precise amount of the layer should be etched because there are features that need to be retained without damage. For instance, uncontrolled isotropic etching contributes to the formation of undesirable gaps when the material to be etched is sandwiched between two layers which are resistant to etching. For instance, as shown in FIG. 1, layer 1 and substrate 3 are resistant to etching and layer 2 is readily etched by the isotropic etching process. If an opening is created in layer 1, then isotropic etching of layer 2 produces a gap 4 in layer 2 underneath the opening in layer 1. It is clear, therefore, that what is needed is a controlled etching system which is able to etch the precise thickness of the layer of interest without overetching and accentuating the gap between unetched layers.

One of the most important cleaning and etching steps in the semiconductor industry is to remove native oxide from the surface of silicon. Oxide etching by immersion in aqueous solutions containing HF can yield pristine Si surfaces chemically passivated by hydrogen atom termination of silicon dangling bonds. Chemical passivation reduces reoxidation of silicon upon exposure to air, but it does not reduce contamination by particulates or large organic molecules. Integration of an aqueous silicon dioxide removal process with an evacuated, multichamber wafer processing tool designed to minimize particulate contamination is difficult. Hence, a process that takes place in the gas phase at low pressure, instead of in a liquid, is needed.

Silicon dioxide has been successfully etched or removed from the surface of a silicon wafer by a number of methods that do not use aqueous solutions and which take place with medium or low pressures of reactive molecules or ions. Examples include reactive ion etching (RIE), and heating the wafer to 900° C. temperature for the reaction $Si(s) + SiO_2(s) = SiO(g)_4$. However, these techniques do not etch by reacting with the layer of material to be etched and a condensed film containing the reactant molecules. Therefore, they are not considered prior art and will not be discussed.

Prior art generally concerns reactions where films are present on a surface during reaction. Some art does not recognize the existence of films on the surface. Other art recognizes the existence of films and the role they play in etching, but does not recognize the importance of the films, nor how to properly control them. Inaccuracy and lack of control in the prior art often arise when there is inadvertent transition between regimes, as described herein infra.

In etching of silicon dioxide, prior art has reported different etch rates for TEOS, thermal silicon dioxide, and other types of silicon dioxide. The rate is limited by the reactivity of the reactant toward silicon dioxide. The reactivity varies according to structural and compositional differences in the silicon dioxide. The rate of passage of reactant through a film did not limit the rate of reaction with these oxides.

U.S. Pat. No. 4,264,374 to Beyer and Kastl discloses a way to use gaseous vapor to remove native oxide from silicon. Oxide etching by exposure to gaseous mixtures of HF, $H_2O$, and $N_2$ near atmospheric pressure has very high selectivity for removal of silicon dioxide without removing silicon. As the pressure of a process increases, problems from contamination by particulates and gaseous impurities increase. Hence, a lower pressure process is needed.

The equipment described by Deal et. al (J. Appl. Phys. 36:3370, 1965) and Novak (Solid State Technology, 31:39, 1988) is currently available and is designed to etch oxide layers using gaseous mixtures containing HF and $H_2O$. However, the equipment is not designed to control the surface residence time, the thickness or composition of condensed films in the etching system. An inert gas is bubbled through water or through a solution of HF in water in a container called a bubbler. The pressure of water vapor or HF and water vapor entrained in the inert gas is equal to the vapor pressure at the temperature of the bubbler. Flow controllers regulate admission of the gases into an unheated chamber holding the substrate. The bubblers and gas lines are heated. In equipment described by Deal et al supra, the substrate can be heated, and the total pressure can be regulated by altering the pumping speed of the system. There is no quartz crystal microbalance in the system, and the substrate cannot be cooled. Etching is restricted to high chamber pressures. It is a flow system with no capability to isolate the reaction chamber from the vacuum pump.

Another method for removing oxide is mentioned by Nishino et al (Proceedings of the Symposium on Dry Process, Inst. of Elec. Eng. of Japan, Tokyo, Oct. 30, 1989, p. 90) in a report on microwave discharge cleaning of silicon. Exposure of silicon covered with a native oxide to gases from a heated container filled with ammonium fluoride or to a microwave discharge in $NH_3$ and $NF_3$ gas followed by raising the temperature of the silicon can remove the oxide. In a separate experiment, HF and sulfuric acid were formed following activation of precursor molecules in a discharge. Nishino et al does not deal with the type of gap illustrated in FIG. 1, nor with any other undesired effect induced by overetching, etc.

In summary, prior art apparatus for etching with condensed films containing reactant is not designed to control the composition and residence time of the film. The following items are missing in prior art equipments: a monitor of thin films such as a microbalance, a means to maintain the wafer as the coldest point in the chamber, separate gaseous sources of $NH_3$ and HF, sources of $NH_3$, $H_2O$, and HF, an ammonium bifluoride source, and low pressure sources such as effusion cells, or sources with a differentially pumped region, there is no ability to maintain the chamber wall temperature above the temperature of any reactant source which is a condensed liquid or solid, the vacuum pump cannot be isolated from the chamber, and there is no ability to simultaneously open/shutoff valves between gas sources and chambers.

The design of the prior art etching systems is necessarily dependent on the devices and methodologies known at the time and can be understood by considering the design of available systems, such as reactive ion etching systems, used for etching a surface when the reactant does not condense on the surface. The rate at which reactant strikes the surface to be etched is proportional to the pressure of the reactant in the chamber. As long as the reactant pressure is below its vapor pressure at the temperature of the substrate, reactant may adsorb on the surface for a short period of time, but is does not condense to form a multilayer. The pressure of reactant, and therefore the reaction rate, is controlled by varying the rate at which the reactant is admitted to the chamber and the rate at which the reactant is removed from the chamber, e.g., by the pump attached to the chamber. The admission rate of reactant to the chamber can be regulated with a flow meter. This type of equipment is also used in the prior art to carry out reactions when the reactant condenses on the surface of the substrate to be etched even though initiation and control of the reaction is very different when a condensed reactant film forms on the surface to be etched. The differences are more fully set forth below.

When a condensed reactant film forms on the surface, the composition of the condensed film is more important than the composition of the gas phase. The partial pressure of reactant in the gas phase is not as important because the gaseous reactant is not in direct contact with the surface to be etched. Instead, the condensed reactant film is in contact with the surface, and therefore the composition of the condensed reactant film is more important than the composition of the gaseous ambient in determining how fast the surface will be etched, and how much of the surface will be etched. The composition of the gas affects the reaction only indirectly as gaseous reactants are transported through the condensed film to the surface. A central problem is that condensed multilayer films can form on surfaces other than the layer to be etched, such as chamber walls or areas of the wafer-mount which may be colder than the surface of the wafer. The layers that form on these extraneous surfaces can serve as a source or sink for reactant so that there is no longer a definable relationship between the composition and timing of gases admitted to the chamber and the composition and residence time of reactant layers on the surface of the wafer to be etched.

Deal et al, supra, mention the presence of an aqueous film on the surface of the oxide during vapor phase etching, but do not recognize the importance of controlling the film. Instead, the systems described by Deal and Novak use flowmeters to admit reactant to the chamber. Referring to FIG. 2a, the operation of the prior art equipment may be described as follows: nitrogen from reservoir A passes through mass flow controllers B and into a bubbler C containing water or bubbler D containing a mixture of HF and water. After passing through the bubbler, the gas enters chamber E where a wafer F is mounted on a room temperature holder G. In some equipment, the gas and reaction products pass from chamber E through a regulating valve H before being pumped away.

Although suitable for etching reactions not involving a layer of condensed reactant, this system can cause difficulty in any reaction which occurs when condensed reactant forms on the surface of the layer to be etched. When a flowmeter admits gas to a chamber at a constant rate, the pressure rises slowly until the pressure is high enough for the chamber vacuum pump to remove the gas at the same rate at which it is admitted to the chamber. This slow pressure rise contributes to an ambiguous onset time for condensation, an indefinite film thickness and an ambiguous composition.

The formation of a film on a surface from constituents in the gas phase is known to be regulated by the temperature of the surface and the partial pressures of the gaseous constituents. Once the partial pressure of the gaseous constituents rises to a value equal to or greater than the vapor pressure, a condensed film will form. If the pressure rise is slow, the onset time for condensation is ambiguous. Once condensation begins, the partial pressure of the gaseous constituents of the film will remain equal to the vapor pressure of the constituents. Condensation continues, and the thickness of the condensed film increases because the system pump is unable to remove the constituents of the film at the same rate at which they are admitted.

Control of the extent of film removal by the apparatus described by Deal et. al. and by Novak, supra, is therefore difficult. Since a flow controller is used, the partial pressures of water and HF in the chamber rise slowly after initiation of flow. Thus, the time at which the condensation occurs and the reaction is initiated is not well defined. The thickness of the film increases with time. The composition of the gas above the film will change with time in a complex fashion because as the reaction proceeds ($SiO_2 + 4HF = SiF_4 + 2H_2O$), HF is consumed and $H_2O$ is produced as a byproduct. Thus, the surface area of oxide being etched can affect the gaseous composition. Finally, condensation on the walls of the chamber serves as an additional unpredictable source or sink for HF because the gaseous HF will exchange with HF in the condensed film on the walls of the chamber.

Exchange of constituents in the gas with constituents in the condensed film can be understood by referring to FIG. 2b from p. 148 of Physical Chemistry by Farrington Daniels and Robert Alberty, 3rd ed. 1966, Wiley, N.Y. It shows how the equilibrium composition of the vapor of a two component mixture of benzene and toluene varies from the composition of the liquid as a function of temperature. Similar curves hold for all binary mixtures including $HF/H_2O$. The x axis shows the fractional composition of the mixture and the y axis shows the temperature. If vapor is admitted to a chamber with the composition of point b, it will condense on an object whose temperature is below about 94° C. The composition of the vapor, represented by point d, is very different than the composition of the liquid represented by point c. In other words, as soon as condensation occurs, re-evaporation will alter the composition of both the condensed film and the gas phase.

The exact details of how these compositions change with time will have a complex dependence on the absolute and relative amount of condensed film on the walls and on the substrate, flow rates, absolute pressures etc. The absolute amount and relative amount of condensed film on the walls of the chamber and on the substrate will also depend on the ambient temperature and on the temperature difference between the substrate and the chamber. The actual curve for HF/H$_2$O binary mixtures shows the existence of an azeotrope. Azeotropes are certain fractional compositions of a binary mixture where the vapor, and liquid in equilibrium with the vapor, have the same composition. Although Deal et. al. mention use of the azeotrope in a bubbler as a supply of HF and water, they combine this with a bubbler containing water so that the gaseous composition inside the chamber is not the composition of the azeotrope.

U.S. Pat. No. 5,030,319 to Nishino et. al. provides an understanding of etching mechanisms where films that contain reactant are used for etching. However, the etching apparatus and method are in some ways more difficult to use despite an improved understanding of the films. For instance, a flow system is used to admit gases with all the potential problems mentioned above. In addition, reactant is created through reaction of precursor molecules activated by a plasma discharge instead of direct admission of the reactant. The formation of condensed multilayer reactant films, therefore, depends not only on temperatures, flow rates, pumping speeds, etc.; but also on the characteristics of the discharge and the reaction of activated precursor molecules. Furthermore, reactive radicals or molecules in the gas phase can consume, react with, or chemically transform films on the wafer or walls.

The Nishino patent teaches that a discharge in NH3 and NF3 forms HF which can combine with ammonia to form ammonium fluoride layers that react with SiO$_2$ to form an ammonium hexafluorosilicate product. Reaction can also occur by dissolution of reactant within the product layer. The results indicate that not all the silicon dioxide which reacts is left behind as a film on the surface of the oxide. FIG. 2 of the Nishino patent shows the etching rate and film thickness for a 10 minute etching time as a function of the NH3 to NF3 ratio. The etching rate of around 10–40 Angstroms/min corresponds to removal of 100 to 400 Angstroms of silicon dioxide. If all the reacted silicon dioxide were converted to ammonium hexafluorosilicate product resident on the surface, the thickness would be approximately 300 to 1200 Angstroms, far thicker than the film thicknesses shown in Nishino's FIG. 2. Some of the silicon from the reacted silicon dioxide does not remain resident on the surface in the form of ammonium hexafluorosilicate. When the product film is thin, it can be "broken away", but after continued etching it can no longer be "broken away" and etching is terminated. The termination thickness of etched oxide in FIG. 15 of Nishino patent is about 1000 Angstroms, a thickness far larger than needed to prevent undercut shown in FIG. 1 of this application. The decrease in etching efficiency is presented as a problem which can be remedied by alternating several short reaction and product desorption cycles instead of etching for one long period of time.

If a thin film is formed with a short 10 minute discharge, the film remains permeable to reactant, if hydrogen is substituted for ammonia in the discharge HF is formed and in fact the presence of the film increases the reaction rate. The film does not inhibit the reaction.

Nishino further teaches that radicals such as O$_2$ and fluorine atoms in the discharge influence the reactions in several ways. They can affect the selectivity of etching silicon vs. silicon dioxide. When H$_2$SiO$_4$ and HF are formed in the discharge, fluorine atoms are consumed within the condensed film when it is thick, but fluorine atoms are not consumed when the condensed film is thin. When the film is thin, silicon is etched; when the film is thick, silicon is not etched. These reactions can complicate controlled etching.

It may be further noted that any apparatus using a condensed source of reactant at a temperature hotter than the wafer surface is able to make a transformation between regimes. If reactant is admitted slowly, there is no reaction initially, because an adsorbed film does not form. As the pressure of reactant slowly increases to near the vapor pressure at the temperature of the wafer, then an adsorbed film can form which etches the surface. The adsorbed film composition is closely related to the composition of the gases in the chamber. When the pressure exceeds the vapor pressure of the material in the chamber, there is condensation of a multilayer. The multilayer forms a reservoir, especially if it is a liquid multilayer, the composition of which is no longer directly connected to the composition of the gases in the chamber. No prior art system is designed and operated to stay in the regime where an adsorbed film of a layer or less is responsible for etching.

Furthermore, constant slow rate admission of reactant with flow controllers to a chamber using apparatus mentioned in the prior art does not lead to accurate etching or removal of thin layers, because the composition and residence time of the reactant film is not controlled: e.g., the time at which a condensed film of reactant is formed on the surface is uncertain, the length of time condensed film remains on the surface is unknown, condensed film can form on the walls of the chamber or portions of the wafer mount which are colder than the wafer, the fraction of the reactant which is admitted to the chamber and eventually condenses and reacts is unknown, the substrate is not cooled sufficiently to facilitate use of a low pressure source, the self limiting reaction thickness of solid products is uncertain, a wafer is not held at or slightly above the temperature of a source of condensed reactant so that reaction can occur within the adsorbed film regime, and the presence of activated radicals or molecules can complicate the composition of films.

It is clear from the above that improvements in the prior art apparatus and method are needed.

SUMMARY OF THE INVENTION

It is, therefore, an object of the present invention to provide a process and a device, comprising means for controlling: (1) the thickness, (2) the composition, and (3) the duration or the surface residence time of condensed reactant film for the purpose of accurately etching a desired thickness of a layer on a substrate.

The apparatus comprises the following components:
a chamber;
means for supply of reactant to said chamber;
a material on a substrate, said material able to be etched by said reactant;
means for supporting said substrate within said chamber;
a film comprising said reactant on the surface of said material;
means for controlling the nature and duration of said film;
wherein the components are so arranged that when said reactant is supplied to said chamber, said reactant forms a film on the surface of said material, the nature and duration of said film being so controlled by said controlling means that said film leads to the removal of an accurately controlled amount of said material on said substrate.

The method comprises the steps of:
(a) supporting, in a vacuum chamber, a substrate having a material to be etched;
(b) admitting reactant containing gas into said chamber at a sufficient pressure so as to form a film of the reactant on the surface of said material;
(c) controlling the composition and residence time of said film on the surface of said material so as to etch an accurate amount of material on said substrate; and
(d) removing any unwanted reactant and reaction products from the chamber or surface of said substrate.

It is a further object of the invention to carry out etching over a wide range of chamber pressures. Etching of the layer on the substrate takes place by chemical reaction of the reactants in the condensed film or cluster (aggregate) of molecules formed on the layer to be etched.

An important feature of this invention is that the apparatus and method used for the etching reaction are designed to control the condensed or adsorbed film of the reactant forming on the surface of the substrate. In contrast, a constant rate of admission of the reactant gas into the reaction chamber, as described in the prior art, does not allow control over the composition, thickness, or surface residence time of the film.

The present invention for the first time provides means for controlling the composition, thickness, and surface residence time of the film of condensed reactant on the surface to be etched, thereby precisely controlling the extent of the etching reaction.

Several aspects need to be considered in order to control the condensed film over a wide range of total system pressure and with a wide range of reactant molecules. As will be discussed more fully, infra, control or elimination of condensed films on the surface of the chamber aids in the control of the condensed film on the substrate. A microbalance (quartz crystal microbalance, QCM), ellipsometer or other monitoring devices well known to a skilled artisan, provides control of the reactant film thickness over the entire range of pressures. Rapid delivery of gaseous reactant to the substrate establishes a precise time for initial condensation of the reactant film and contributes to a constant gaseous concentration. At low total chamber pressures, a cooled substrate and delivery of reactant with a collision-free or substantially collision-free source aids formation and control of the condensed reactant film. When the condensed film comprises a multicomponent mixture which forms an azeotrope, admission of the components to the chamber at the composition of the azeotrope aids the formation and control of the adsorbed film.

Although the preferred embodiments describe various aspects of the invention, each individual aspect of the invention increases the degree of control over the condensed reactant film and constitutes a distinctive feature of the present invention.

Indeed applicants found results contrary to those of Nishino when ammonia and HF are added directly instead of being synthesized in a discharge which can also create reactive radicals. The stoichiometric amount of ammonium hexafluorosilicate product is formed in a layer on the surface. The reaction is self-limiting by a different mode than with Nishino's activated reactants, with the ability to "break away" the film playing no role in termination of the reaction. A termination thickness is found small enough (less than 200 Angstroms at room temperature) to minimize the sort of undercut shown in FIG. 1. At temperatures below Nishino's, there is a drop in the amount of silicon dioxide removed which indicates that diffusion of reactant through the film is inhibited, and that the termination thickness can be controlled.

Inventors also observed other surprising results. For instance, initial etching of TEOS, thermal silicon dioxide, and other oxides that are predominately $SiO_2$ occurs at different rates, but the product layer increases in thickness and rates become similar as the rate of diffusion of reactant through the product layer becomes rate limiting. The diffusion through product layers is constant so that even though the inherent reactivity of HF is greater for TEOS than for thermal oxide, the termination thickness determined by diffusion is similar. Ammonium bifluoride etches at a considerably lower pressure than ammonium fluoride. At temperatures below $-35°$ C., it is possible to operate at pressures many orders of magnitude lower than in any prior art, with essentially every reactant molecule which strikes the surface sticking without re-evaporation.

BRIEF DESCRIPTION OF THE DRAWINGS

The foregoing and other objects, aspects and advantages will be better understood from the following detailed description of the preferred embodiments of the invention with reference to the drawings in which.

DETAILED DESCRIPTION OF THE INVENTION

The above and various other objects and advantages of the invention are achieved by an apparatus and a method designed to control the formation of surface films. The invention employs means for detecting and controlling films of less than a layer thickness under real reaction conditions. This is accomplished, inter alia, through the use of a quartz crystal microbalance and well defined reactants, thereby helping to classify this type of reaction into several regimes and to define preferred embodiments of the invention over a broad workable range of pressures and temperatures. The main regimes are reactions stemming from (1) adsorbed films of a layer or less, (2) condensed liquid films, and (3) condensed solid films. In a fourth regime, when there is no surface film, there is no reaction.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the methods and materials described herein are preferred. Unless mentioned otherwise, the techniques employed or contemplated herein are standard methodologies well known to one of ordinary skill in the art. The materials, methods and examples are only illustrative and not limiting.

In accordance with the present invention, described herein is an apparatus for rapid delivery of ammonia and hydrogen fluoride gas with the option of an elevated substrate temperature (FIG. 4); an apparatus for rapid delivery of hydrogen fluoride and water (FIG. 4); apparatus for low pressure etching which uses a differentially pumped source such as an effusion cell or molecular beam for delivering vapors to a substrate coated with $SiO_2$ (FIG. 3); and the combination of a microbalance with any of the above apparatus to control the etching reaction. Furthermore, method and results are presented (1) to distinguish when a reaction occurs by condensation of reactant or by gaseous exposure, and (2) to show that reaction is controlled by a condensed film. The specific system comprises the etching of $SiO_2$ when a condensed film is formed from HF and ammonia precursor gases.

Various embodiments of the invention are now set forth.

1. Apparatus and Method For Rapid Delivery of Reactant

Figure 4:
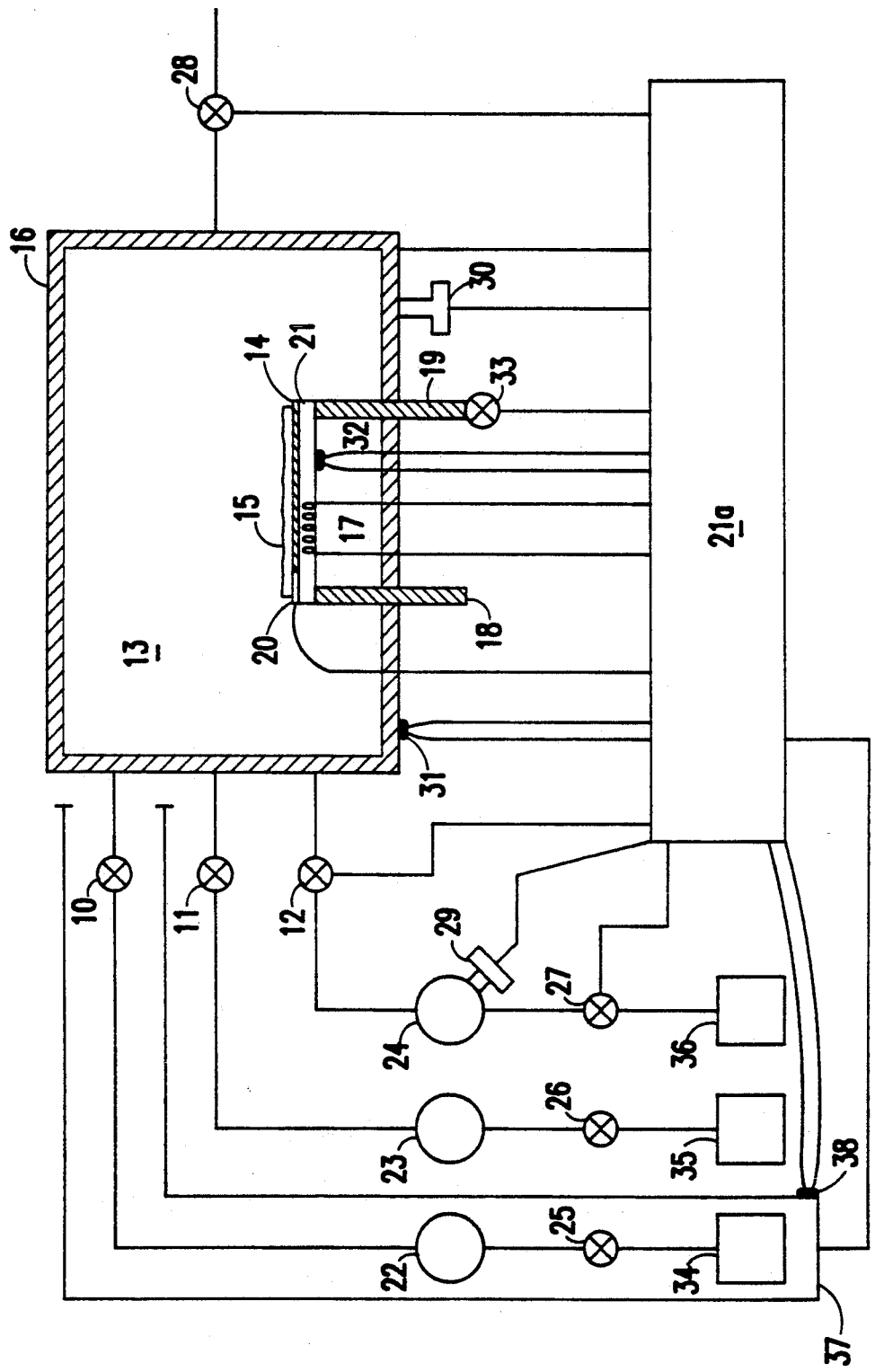
FIG. 4 is a cross-sectional side view of an embodiment of the present invention for precise etching of a thin layer. The apparatus uses a source of gaseous reactant which can rapidly deliver reactant to the wafer.

Referring now to the drawings, and more particularly to FIG. 4, there is shown a preferred arrangement for precise etching of a thin layer by controlling the film condensed on the surface of a substrate. Valves 10, 11, and/or 12 are simultaneously opened in order to rapidly admit reactant, or reactant and catalyst, to the reaction chamber 13. Gas admission is rapid because the open diameter of valves 10, 11 and 12 is larger than the diameter of the regulating valve in a flowmeter. Immediately after admission, the pressure of the admitted gases is maintained above the condensation pressure at the temperature of the substrate 14. This results in the formation of a condensed film 15 on the surface of the substrate 14. It is to be noted that while the pressure of the admitted gases is above the condensation pressure at the temperature of the substrate 14, the pressure of the admitted gases is below the condensation pressure at the temperature of the chamber 13, because the chamber is heated to above the substrate temperature by heater 16. The substrate can be heated by heater 17 or cooled by flowing coolant in tubes 18 and 19. Both, a quartz crystal microbalance 20 containing a crystal coated with the same material as the layer to be etched, and the substrate 14 are attached to the substrate mount 21. The signal from the quartz crystal microbalance 20, reservoir pressure monitor 29, chamber pressure monitor 30, chamber temperature monitor 31, and wafer/microbalance temperature monitor 32, goes to a controller 21a, which determines and regulates the pressure to which the reservoirs 22, 23, and 24 are filled. The reservoirs are filled from a source of the reactant 34 containing $H_2O$, 35 containing HF, and 36 containing $NH_3$; through valves 25, 26 and 27, respectively. Alternatively, reservoirs can hold solutions containing HF or $NH_3$ and a non-reactive gas could be bubbled through the solutions. The reservoir could be merely a length of tubing or a chamber. The pressures in the reservoirs and chamber are regulated by connections between the controller 21a and valves 25, 26, 27, 10, 11, 12, and 28. Not all connections are shown in the drawings for the sake of simplicity. All sources, reservoirs and tubing leading to the reaction chamber can be heated to obtain reactant pressures greater than the room temperature ($\sim 22°$-$23°$ C.) vapor pressure. A heating shroud 37 is shown on one gas line source and reservoir. The signal from temperature sensor 38 is sent to controller 21a which monitors and controls the temperature of the shroud 37. The shroud 37 and sensor 38 is shown for only one gas line to yield a simpler drawing. However, all lines may have a heating shroud and sensor controlled by 21a. The controller 21a monitors the temperature of chamber 13 with sensor 31 and controls the temperature through the connection to heater 16. The controller 21a monitors the temperature of the wafer 14 and microbalance 20 with sensor 32 and controls the temperature through the connection to heater 17 and coolant regulating valve 33. There are two modes of operation depending on whether valve 28 which leads to a vacuum pump (not shown) is open or closed during admission of reactant.

2. Admission of $NH_3$ and HF

Now described is the first mode of operation where the valve 28 to the vacuum pump is open during admission of reactant. Reservoir 23 is filled with HF and reservoir 24 with NH$_3$. Then valves 11 and 12 are simultaneously and rapidly opened. Reactant fills the chamber and rapidly condenses on wafer 14, microbalance 20 and mount 21 for a sufficiently short period of time when the pressure of NH$_3$ and HF is above the vapor pressure at the temperature of the wafer 14 so that a condensed layer 15 is formed and reaction with the surface of the layer to be etched is initiated. Since valve 28 is open, the condensed film 15 decreases in thickness with time as HF and NH$_3$ at the vapor pressure of the condensed film is pumped out. Finally, all the condensed HF and NH$_3$ which is unreacted evaporates and is pumped out. Exchange between reactant in the condensed film and reactant in the gas phase is minimized because of the short period of time during which the reactant is condensed on the surface at the low ambient pressure in the chamber. The amount of the etched layer which is removed depends on the substrate temperature, composition and residence time of the reactant film. Factors influencing the amount removed includes vapor pressure of the reactant at the temperature of the substrate, the amount of reactant admitted to the chamber, the pumping speed, and the reaction rate between the reactant and the layer to be etched, all of which can be regulated by the controller.

Separate gaseous sources enable easy operation at elevated wafer temperatures when high partial pressures of ammonia and HF are required and enables variation of the HF: NH$_3$ ratio.

3. Admission of HF/H$_2$O

In another mode of operation, the valve 28 to the pump is closed during the admission of reactant. Reservoir 22 is filled with H$_2$O vapor, and reservoir 23 is filled with HF, then valves 10 and 11 are opened to fill chamber 13. The reactant condenses on wafer 14 and microbalance 20 to form a condensed film 15 until the pressure in the chamber drops to the vapor pressure of the reactant at the temperature of the wafer 14. If the condensed film is a liquid, such as with admission of HF and H$_2$O with a wafer temperature above 0° C., then reaction can be continued until all reactant in the condensed film 15 has reacted or until valve 28 is opened and the contents of chamber 13 are pumped away. During the time valve 28 is closed, reactant in the chamber 13 can exchange with reactant in the film 15. The amount of the etched layer which is removed is determined by the amount of HF admitted to the chamber. Once a condensed layer is formed on the surface to be etched, additional HF can be added by refilling reservoir 23 and opening valve 11 without opening valve 28. The reaction is terminated only when valve 28 is opened and the contents of the chamber 13 are pumped away or when the HF which was admitted to the chamber has reacted.

4. Apparatus and Method For Low Pressure Etching

Figure 3A:
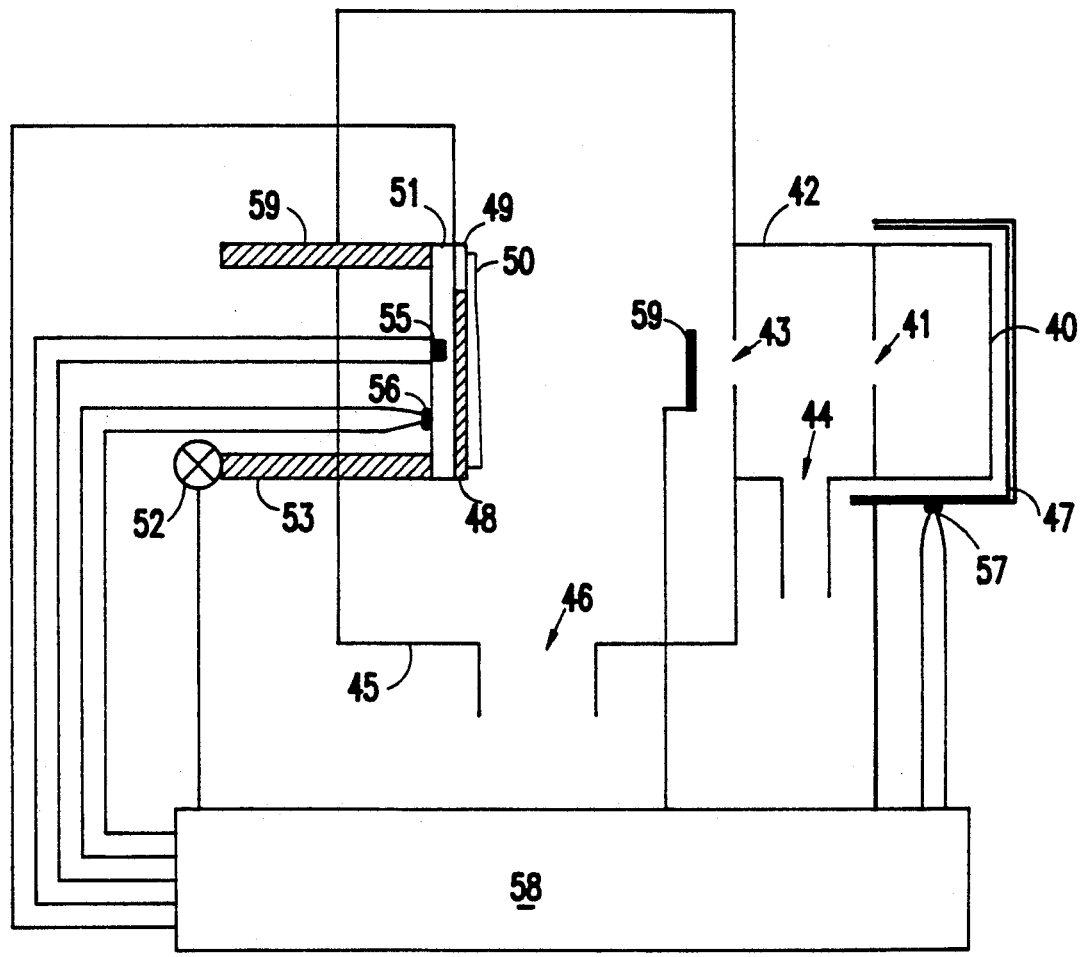
FIG. 3a is a cross sectional side view of an embodiment of the present invention for performing precise etching of a thin layer by controlling the film condensed on the surface. The device incorporates a source of reactant, an effusion cell capable of operating with a low chamber pressure when limited collisions are experienced by reactant molecules travelling from the source to the substrate.
Figure 3B:
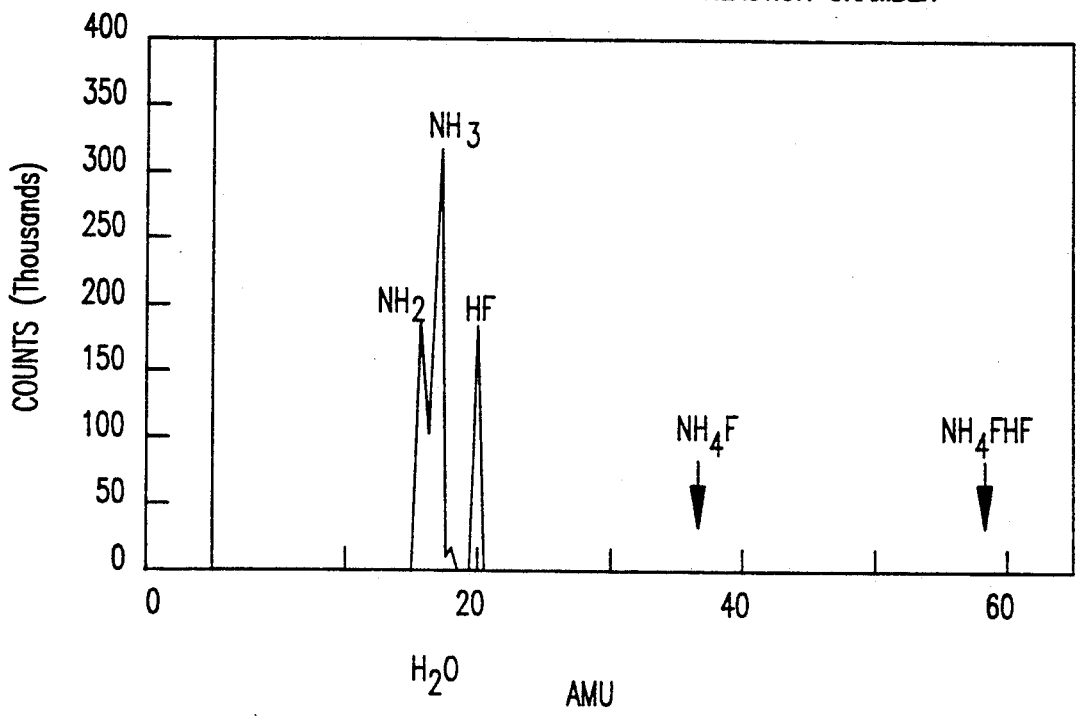
FIG. 3b is a mass spectrum of gaseous mixture present in the chamber when etching of an oxide layer is done with a mixture of HF and ammonia. Water is also present.

Referring now to the drawings and more particularly to FIG. 3a, there is shown a preferred arrangement for accurate etching at low chamber pressure. A key feature is a differentially pumped source of reactant vapors. An effusion cell operating at low pressure is a particularly desirable feature whereby the wafer cannot be exposed to contaminants which may be present at higher pressures. Alternatively, a supersonic source can be used.

The reactant source 40 is filled with ammonium bifluoride and is heated with heater 47 in order to vaporize the solid. It delivers the reactant through aperture 41. The pressure in the chamber 42 and chamber 45 is low enough so that the reactant molecules experience a small number (~0 to 3) of collisions as they pass from aperture 41 to substrate 48. Low pressure is insured by pumping chamber 42 through opening 44 and chamber 45 through opening 46. The incident reactant molecules condense when they strike the cooled substrate 48 or microbalance 49 to form a condensed layer 50 of HF and NH$_3$. The substrate 48 and microbalance are attached to mount 51. The temperature of substrate 48, required for condensation when reactant is present at low pressure, is below the temperature required when reactant is at high pressure. Valve 52 regulates the coolant flow through tubes 53 and 54. Since the chamber 45 pressure is low, there is little exchange between reactant in the gas phase and reactant condensed in the film on the surface of the substrate. The mass spectrum of FIG. 3b was taken during condensation of reactant on the surface. It shows that the vapor predominantly contains NH$_3$ and HF with traces of H$_2$O. The H$_2$O may desorb from the chamber walls. Once the reaction is complete, evaporation of excess reactant and reaction with the layer to be etched can be facilitated by increasing the substrate temperature with heater 55. A controller 58 monitors the wafer temperature with sensor 56, and controls it with valve 52 and heater 55. The same controller monitors the microbalance 49 signal, and can vary the pressure of reactant in chamber 40 by sensing the temperature of chamber 40 with sensor 57 and controlling heater 47. The thickness of condensed film 50 can be controlled by shutter 59.

In alternate configurations, a gas can be delivered to chamber 40 instead of a solid, vapors from a solid can be entrained in a gas, or chamber 42 and chamber 45 can also be heated.

EXAMPLE −1

Figure 5:
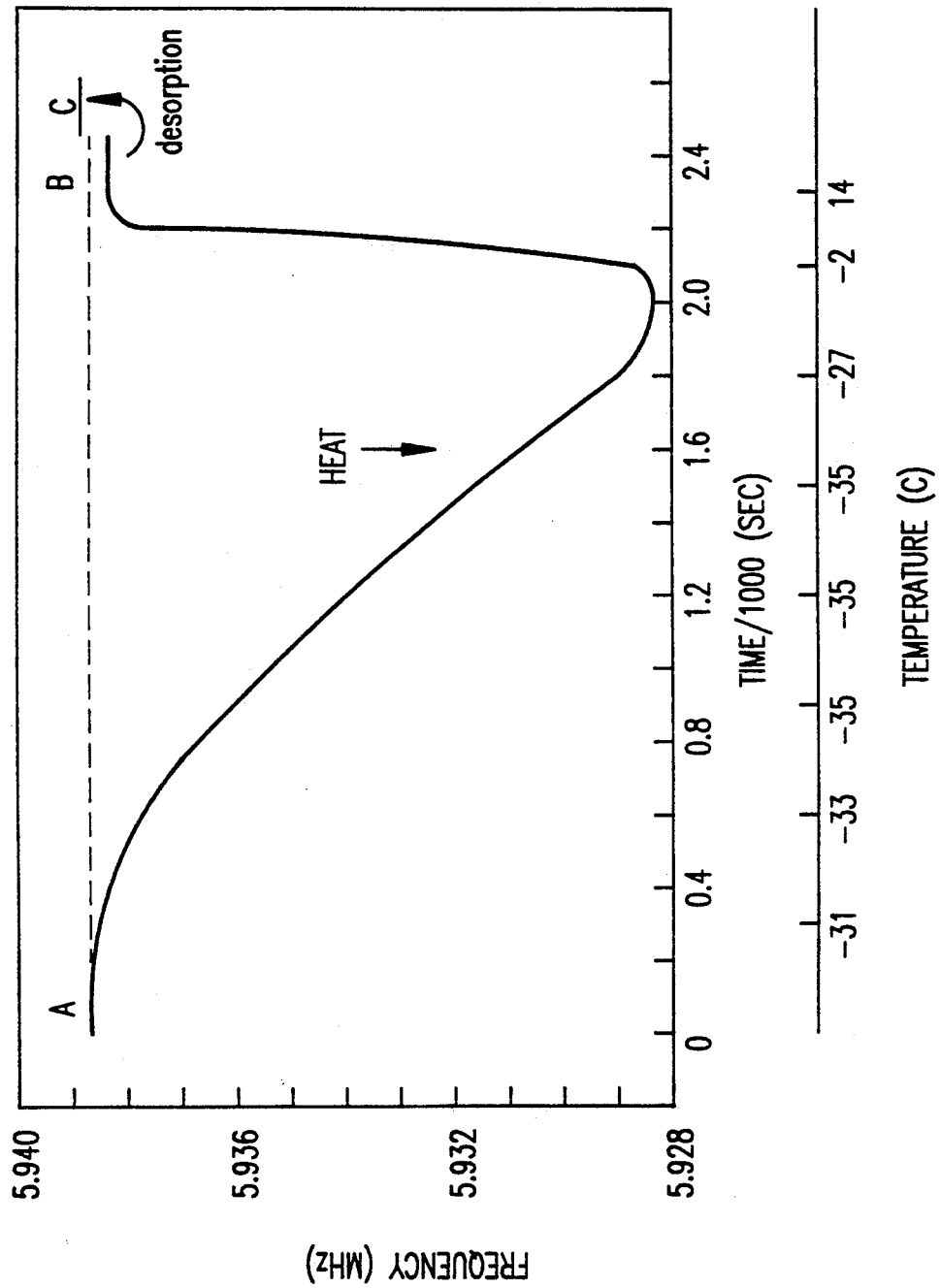
FIG. 5 shows a plot of a microbalance signal as a function of time during control of a condensed film of ammonia and HF on an oxide covered silicon surface.

A specific apparatus and dosing procedure for etching of SiO$_2$ are now described. A stainless steel effusion cell is filled with ammonium bifluoride in air, then inserted in a radiative heater consisting of a tungsten filament shielded by an outer covering of tantalum. Vapors from the ammonium bifluoride pass through a 4.5 mm diameter hole in the center of a copper gasket which covers the cell. The assembly is housed in a small chamber pumped with a turbopump. It mounts on the silicon wafer dosing chamber pumped with a turbopump. The effusion cell is heated to 75°-95° C. and vapors from the ammonium bifluoride are condensed on the −35° C. wafer for about 20 minutes. Although ammonium bifluoride is evaporated from the effusion cell, the composition of condensed reactant on the surface is not determined and is probably not stoichiometric NH$_5$F$_2$. The wafer is heated to 5°-15° C. over the course of 10 minutes, sometimes while still exposed to the ammonium bifluoride vapor. The declining quartz crystal frequency shown in FIG. 5 is due to the condensation of reactants. After heating begins at about 1600 seconds, condensation of reactants continues until about 2000 seconds after which excess reactant rapidly desorbs. Ammonium bifluoride is condensed for a total of about 30 minutes with desorption during the last 3 minutes of the 10 minute heating phase. The frequency at point B is slightly lower than at point A, because a layer containing SiO$_2$ reaction products is not volatile at 14° C. sample temperature. After desorption of the reaction products, the frequency at point C is higher than point A, because part of the oxide layer is etched.

After dosing, the wafer can be directly inserted into a UHV surface analysis chamber with a base pressure of about 10-9 Torr without exposure to the atmosphere. Thus, the apparatus for low pressure oxide removal can be integrated with other vacuum systems.

Apparatus and Method for Etching in the Adsorbed Reactant Regime

A key feature of this embodiment is a source of condensed reactant held at a temperature below the temperature of any other surface in the reaction chamber. Under these conditions all molecules from the source can adsorb only on surfaces and are not able to condense to form multilayer films. In this regime, there is a direct relationship between the composition of gases in the chamber and the composition of the surface film that contains the reactant. If the temperature of the wafer-mount is colder than the condensed source, then a multilayer reactant film can form on the mount which can continue to desorb and produce gas phase reactant which adsorbs on the wafer even after reactant is no longer intentionally added by the source of condensed reactant. Control of etching will also be poor, if the wafer surface is colder than the condensed source. Then a multilayer reactant film can form on the wafer surface and etching will pass from the adsorbed film regime to the condensed multilayer film regime.

Figure 7:
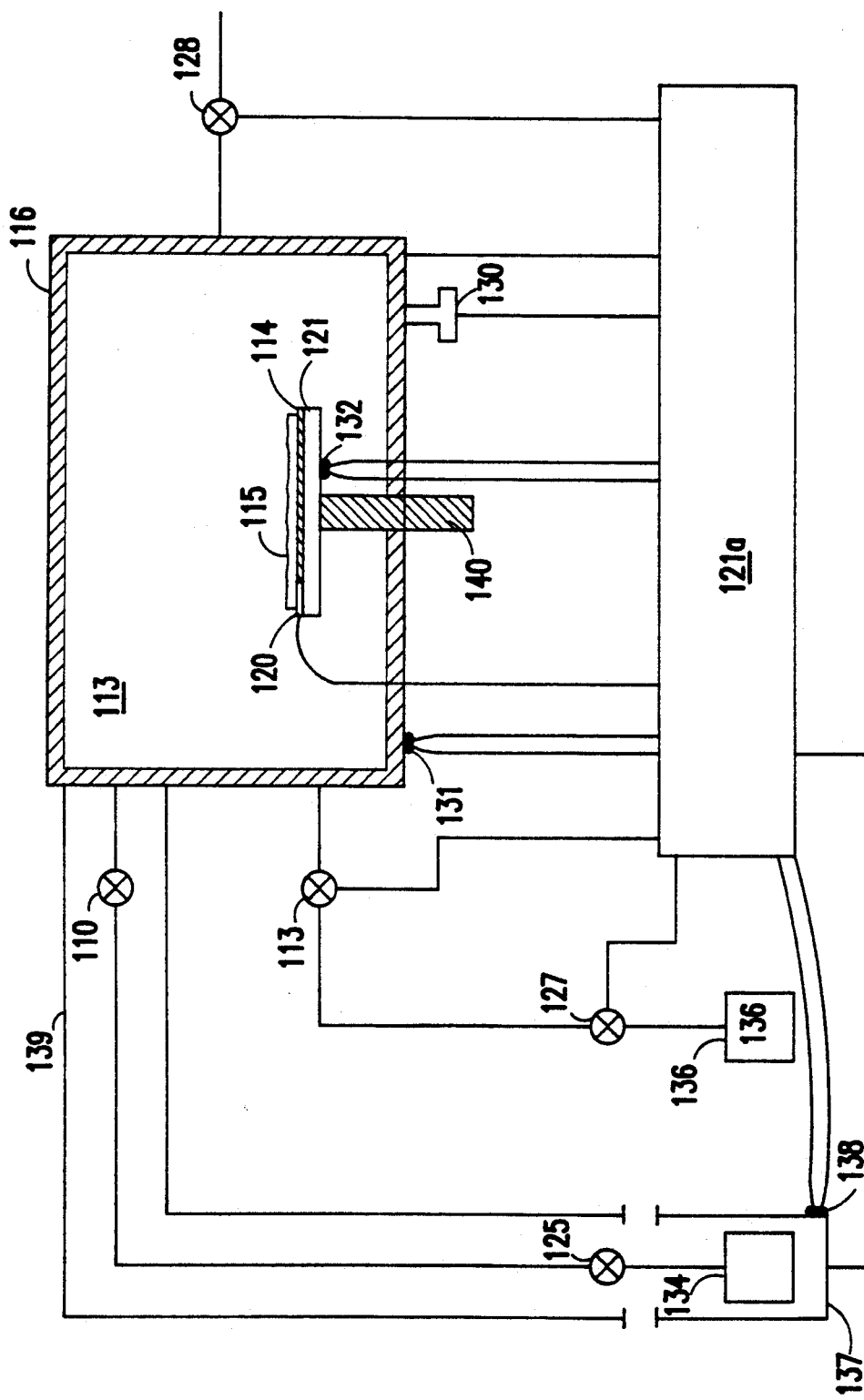
FIG. 7 shows a cross-sectional side view an arrangement of the apparatus for accurate etching with an adsorbed layer of reactant.
Figure 8:
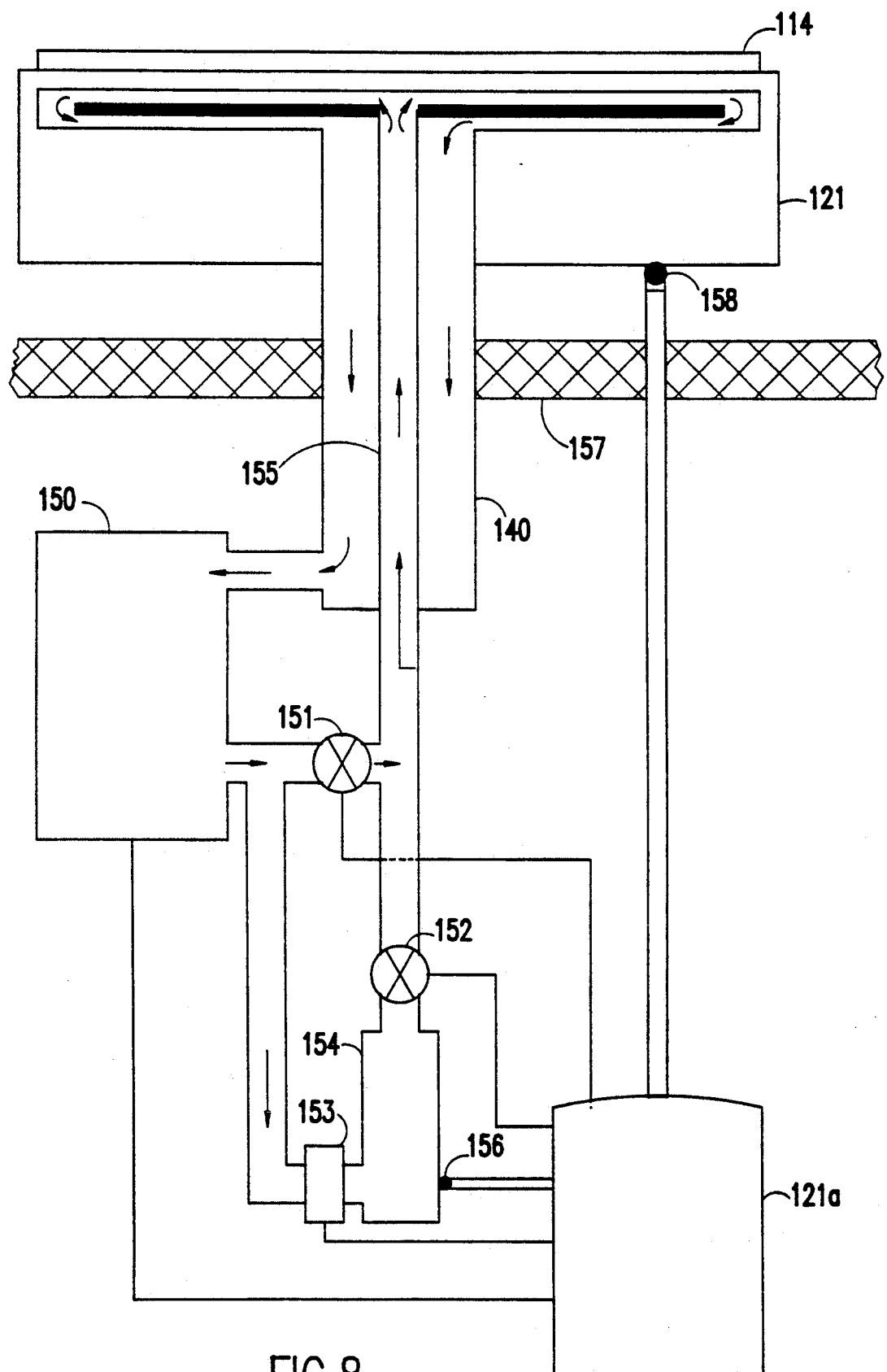
FIG. 8 is the detailed view of the wafer mount and temperature control system.

Referring now to the drawings and more particularly to FIGS. 7 and 8, there is shown a preferred arrangement for accurate etching in the adsorbed reactant film regime. Ammonium bifluoride solid is held within container 134 which is maintained at a temperature equal to or lower than the temperature of any other surface exposed to the vapor above the ammonium bifluoride. This is accomplished by the temperature controlled shroud 137 Which is controlled with thermocouple 138, and controller 121a. Alternatively, the thermocouple could be attached to container 134. The walls of chamber 113 contain a heater 116 so that the temperature of the walls are maintained at a temperature greater than or equal to the temperature of container 134. Thermal conduction maintains the temperature of shroud 139 and portions of wafer mount 121 at a temperature above both container 134 and the surface of wafer 114. Thermocouples 131, 132, 138 and controller 121a ensure proper temperature. The surface of the wafer 114 has two different types of silicon dioxide exposed, for example TEOS oxide and thermal oxide. In the simplest mode of operation, the wafer 114, ammonium bifluoride container 134 and chamber 113 are all at room temperature. Chamber 113 is evacuated, valve 128 to the vacuum pump is closed and both the regulating valve 125 and shutoff valve 110 are opened. HF and $NH_3$ from the ammonium bifluoride cell 134 fills the chamber 113, rising within less than a minute to a "termination pressure", which is approximately equal to the vapor pressure of the ammonium bifluoride at room temperature and detected by pressure monitor 130. Termination pressure approximately equal to the vapor pressure of the condensed reactant in the source and is determined with the sources wafer and chamber all at the same temperature. Once the 'termination pressure" is determined, the temperatures and pumping speed can change and reaction will remain in the adsorbed film regime as long as the pressure in the chamber is equal to or below the termination pressure at the temperature of the wafer. (See the description of the manufacturing system below.) After valve 110 is opened, a film 115 of a monolayer or less in thickness, containing reactant, is adsorbed on the surface of wafer 114 and on the surface of the quartz crystal microbalance (QCM) coated with silicon dioxide 120. The pressure inside the chamber slowly rises beyond the termination pressure as a portion of the $H_2O$ reaction product escapes from the product layer into the gaseous ambient inside the chamber. The mass of the coated QCM 120 increases as the product layer is formed. Valves 110 and 125 remain open during the reaction. It was found that the mass increase from reaction is about twice the mass decrease from removal of silicon dioxide. This mass increase can be used directly to control the amount of silicon dioxide that is etched because none of the reaction product is removed by simply exposing it to the ammonium bifluoride vapor (in contrast to the work by Nishino where activated species remove the film), and because thick reactant layers which could complicate the measurement, do not form on the substrate when reaction occurs in the adsorbed film regime. After controller 121a determines that the signal from QCM 120 is indicative of the desired amount of silicon dioxide having been etched, valve 110 is closed, valve 128 is opened and evacuation of the chamber 116 is begun. Pressure monitor 130 is used to detect any formation of multilayer reactant films inside the chamber by an elevated pressure during desorption of the reactant film. If an unwanted multilayer reactant film is formed somewhere in the chamber, the pressure inside the chamber will not drop immediately when chamber evacuation begins. Further, unwanted reaction, indicated by QCM, can occur if reactant pressure rises high enough during desorption of any unwanted condensed reactant film. The temperature of the heat transfer fluid circulating inside concentric tubes 140 is raised to near 100° C. in order to heat wafer 114 and to desorb the product layer. The pressure, measured by monitor 130 and sent to controller 121a, rises during product desorption. When the pressure drops, desorption is complete, and controller 121a lowers the temperature of the heat transfer fluid circulating inside concentric tubes 140 back to room temperature or slightly above. The processed wafer can be removed, a new wafer loaded, and the system is ready to repeat the oxide removal process.

Similar amounts of TEOS and thermal silicon dioxide can be removed as discussed herein. It is possible to control the thickness of the layer of reaction products and, therefore, the amount of silicon dioxide which is etched by varying the temperature of the reaction, or by altering the $HF:NH_3$ ratio. Controller 121a can lower the temperature of shroud 137 which controls the temperature of the ammonium bifluoride reactant and can lower the temperature of the wafer 114 mounted to holder 121 by lowering the temperature of the heat transfer fluid circulating in concentric tubes 140. Alternatively, the temperature can be raised. Once again, the temperature of the condensed source of reactant is maintained below the temperature of every other surface that is exposed to the reactant vapor so that no condensed multilayer films form within the chamber. The temperature control system is described herein infra. The $HF:NH_3$ ratio can be increased by opening valve 112 and adjusting valve 127 with controller 121a to admit HF gas from container 136 until a desired pressure increase is detected by pressure monitor 130.

HF can be added before or after admission of vapor from the ammonium bifluoride cell.

Other condensed sources of reactant can be substituted for condensed ammonium bifluoride. In a manufacturing version of this embodiment, a quartz crystal microbalance coated with silicon dioxide might not be included even though it is preferred. In the manufacturing version, only temporary use of an appropriate thin film monitor such as a QCM may be necessary to calibrate the process so that the operation remains in the adsorbed reactant regime.

For instance in some manufacturing systems, it may be difficult to completely close valve 128. It can then be advantageous to heat shroud 137, container 134, shroud 139, and chamber 116 to a temperature above the temperature of the wafer 114. If valve 128 does not close all the way, then the pressure will be reduced below the termination pressure. Since the optimum pressure of the reactant is near the termination pressure, heating the reactant source 134 will boost the pressure back to the termination pressure. However, the invention will work at pressures 10 to 20 times less than the termination pressure. Reactant will continuously flow from the source 134 into the chamber and out valve 128. Tests with system where the valve 128 can be closed or with an uncoated QCM crystal enable rapid calibration of the manufacturing system so that it can simultaneously operate at the optimum "termination pressure" while avoiding condensation of a multilayer reactant film.

Figure 11:
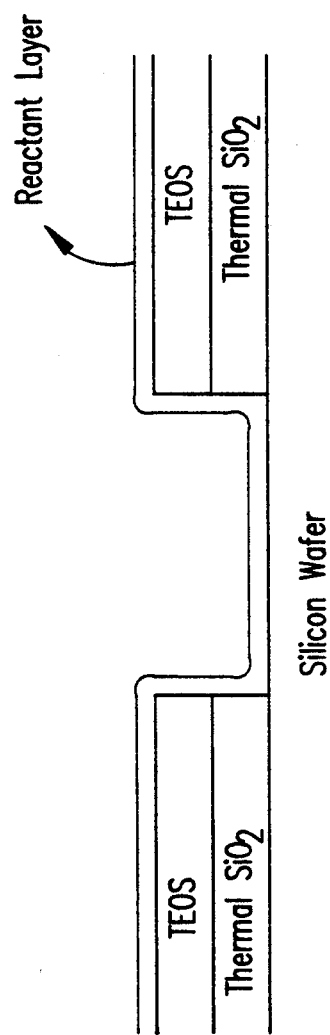
FIG. 11 typifies the films and the layers present on the substrate in the embodiments of the present invention. The top layer is the condensed or adsorbed film of reactant or reactant diffused in a condensed film. The next layer underneath is the layer of tetraethoxy silane(TEOS) silicon dioxide, below which is the layer of thermo $SiO_2$ and the substrate is that of silicon. Other types of $SiO_2$ which contain such atoms as arsenic, phosphorous, boron and the like could, of course, be substituted.

FIG. 11 represents the films and layers present on the substrate in the embodiments of the present invention.

Temperature Control System

It is preferred that the temperature control system maintains the surface of the wafer as the coldest surface in contact with the reactant gases to avoid the possibility that a condensed multilayer film will form on any other part of the wafer mount. The temperature control system should also offer a convenient way to cool and heat the wafer between $-40°$ C. and $100°$ C. for removal of silicon dioxide by treatment with HF and $NH_3$. FIG. 8 shows a solution that uses concentric tubing filled with heat transfer fluid with the cooled inlet in the center and the hotter return on the outside, thus the hotter outside tube is in contact with reactant gases. There are two phases of temperature control. In the first phase the wafer is below $100°$ C. and reaction of the oxide layer occurs. In the second phase, the wafer is heated to near $100°$ C. to remove the product layer. Fluid from the temperature controlled circulator 150 is cooled to the low temperature of the first phase. The fluid flows in the direction of the arrows. Valve 152 is closed so that the fluid flows through valve 151 and into the inner concentric tube 155. The inner tube 155 delivers the fluid on the inside of wafer mount 121 near the backside of wafer 114. The fluid flows in the direction of the arrows and is returned to the outer concentric tube 140. It passes through the wall 157 of the chamber, and back into the circulator 150. During this phase, power supplied to the inline heater 154 by the controller 121a is reduced because there is no fluid flow through the heater. In the second phase, the temperature of the wafer 114 must be raised to near $100°$ C. as monitored by thermocouple 158. Controller 121a closes valve 151 and opens valve 152 so that fluid must flow through flow restrictor 153 then through inline heater 154. Thermocouple 156 is used to monitor the temperature of the fluid leaving heater 154. Controller 121a adjusts the power applied to the heater 154 or the rate of flow through the flow restrictor until the temperature measured by thermocouple 156 is near $100°$ C.

Thin Film Monitor

The invention uses two types of film monitor. One type can detect films on a surface, and the other type can detect films that are desorbing from a surface into the gas phase. To be useful the surface film monitor must be able to detect films of less than 700 Angstroms thickness. The Quartz Crystal Microbalance is preferred because of the sensitivity, accurate calibration of absolute amounts of film and ease of use, but an ellipsometer or an infrared beam which strikes the surface can also detect surface films and aid in their control. Other monitoring devices may also be employed. A pressure monitor can detect films that desorb into the gas phase. Any pressure sensor able to detect fractions of a milliTorr is preferred. However, an infrared beam which passes through the chamber, or a mass spectrometer could also be used to detect pressure changes in the chamber.

These monitors aid control of etching in a number of ways. For instance, when etching $SiO_2$ with $NH_3$ and HF in the adsorbed film regime, the amount of product film is proportional to the amount of silicon dioxide etched. This film can be detected on the surface and the reaction terminated by the controller. In other etching systems, the onset of condensation can be determined, and film thickness changes can be detected so that the correct amount of reactant and correct residence time is ensured by the controller. A QCM coated with $SiO_2$ can detect loss of $SiO_2$.

A monitor of films desorbing into the gas phase can determine if unwanted films are condensing somewhere inside the chamber; if they are, the controller can alter the temperatures to eliminate the films. The monitor can also ensure that all of the product film is desorbed.

Use of a Microbalance

The quartz crystal microbalance (QCM) frequency is recorded as a function of time with a personal computer based multichannel scaler incorporated within the controller described in the embodiments. The oscillator supplied with the microbalance is powered by an oven stabilized 5 V power supply through an RF choke (not shown in the drawing). The oscillator signal on the voltage supply line is AC coupled to the multichannel scaler.

FIG. 5 shows a microbalance signal during condensation of a reactant layer from a mixture of HF and $NH_3$ gases onto silicon dioxide. Static frequency measurements, such as for determining the frequency difference between point A and point B in FIG. 5, are made at the same temperature to eliminate a small temperature dependence of the resonant frequency of the crystal. Static frequency measurements are made with a more accurate oven stabilized frequency counter rather than the multichannel scaler. The QCM frequency is stable to a few tenths of a cycle per second over the course of an experiment.

The quartz crystal microbalance is used to determine the thickness of adsorbed layers, reacted layers, and removed $SiO_2$ layers. The measured resonant frequency shown in FIG. 5, must be converted into a thickness. A simplified version of the Miller and Bolef equation relating to crystal frequency and deposited film thickness is:

$$T = (N_q d_q / d_f f_c) \{(1/\pi Z)\tan^{-1}(Z \tan[\pi(f_q - f_c)/f_q])\} \quad (1)$$

where $N_q$ is a $1.668 \times 10^-$ Hz-Å for crystalline quartz, $d_q$ is the density of quartz, $d_f$ is the density of the deposited film, $f_c$ is the measured resonant frequency of the crystal, $f_q$ is the resonant frequency of the uncoated crystal, and Z is the acoustic impedance ratio of the quartz crystal and deposited film. Since the layer on the quartz crystal is predominantly sputtered $SiO_2$, a Z of 1.07 and density of 2.2 g/cm$^3$ for fused silica is used in equation (1). For thin layers or for Z close to 1, the expression inside the {} brackets does not differ significantly from $(f_q - f_c)/f_a$ as is the case for the experiments described here. The density of ammonium bifluoride or ammonium hydrogen fluoride is 1.5 g/cm$^3$. A value of 2.08 g/cm$^3$, midway between the two known crystalline forms, is used for the ammonium hexafluorosilicate product 12. Conversion factors for the $SiO_2$ coated crystal are 0.565 Å/Hz for $SiO_2$, 0.83 Å/Hz for ammonium bifluoride, and 0.60 Å/Hz for ammonium hexafluorosilicate.

Demonstration that Condensation or Adsorption of Reactant is Required for Reaction to Occur A characteristic of the type of reaction covered in this disclosure is that the reaction rate decreases as temperature increases. At low temperature, reactant can condense to form a thick multilayer. As the temperature rises above the condensation temperature, a multilayer no longer forms, but molecules will continue to adsorb on the surface for a short period of time before re-evaporation. The amount of adsorbed reactant continues to decline as the temperature rises. Experiments with coated and uncoated QCM crystals confirm that reaction continues to occur at temperatures too high for condensation of a multilayer. The embodiment using an effusion cell as a low pressure source of ammonia and HF reactant and a silicon dioxide surface held at low temperature shows that the gaseous reactant does not react directly with the surface.

The rate of decline of the QCM frequency shown in FIG. 5 dosing curve gives a lower limit estimate of the reactant flux striking the surface of about 7 Å/sec. There is a less than 1 Hz or 3 Hz change in frequency when the $SiO_2$ coated QCM is exposed to this reactant flux for 6 minutes at 18.3° C. or for 20 minutes at 100° C., respectively. This indicates little or no condensation of reactant on the surface and little or no reaction with $SiO_2$.

Without being bound to any specific theory, it is postulated that there are two possible explanations for the observation that removal of silicon dioxide proceeds following condensation or adsorption of reactant. One explanation is that condensation boosts the concentration of a reactant at the surface by many orders of magnitude relative to a gas phase reactant. Ammonia and HF condensed on a cooled QCM has a concentration of about 26 moles/liter compared to an estimated molar concentration of about $10^{-10}$ moles/liter for the flux of gaseous reactants incident on a heated QCM. A second reason that the reaction could occur in the condensed phase at a higher rate than in the gas phase, is that the form of the reactants can change when condensed, more specifically, ions can form. High dielectric constant solvents efficiently stabilize ions or reaction transition states possessing ionic character. The best high dielectric constant solvents are hydrogen bonding solvents such as water, ammonia, and HF because the polar hydrogen bonds can reorient in the vicinity of an ion to provide additional stabilization. A solution of HF in water results in formation of the bifluoride ion, $HF_2$, which has a reactivity towards $SiO_2$ about 5 times that of HF. IR spectroscopy detects $HF_2$ in condensed layers containing ammonia and HF. The relative reactivity of $HF_2$ and HF in condensed films containing HF and $NH_3$ is not known.

Etching Control through Use of Condensed Solid Layers

Although ammonium hexafluorosilicate has been observed as a reaction product following reaction of silicon dioxide in HF containing solutions or plasmas, we have discovered that a layer of ammonium hexafuorosilicate products can be used to control the reaction of HF with silicon dioxide. The discovery stems from measurements of the reaction rate of silicon dioxide when a product layer of known thickness is formed on the oxide surface from ammonia and HF gas precursors. Products formed by reaction in solution, or in plasmas can be dissolved or removed by ion bombardment, eliminating their effectiveness in controlling reactivity. The use of condensed layers to control reactivity of a surface can be applied to systems other than the reaction of HF with silicon dioxide in a condensed film of HF and ammonia.

When a solid layer of products is formed on the surface, then the amount of the etched layer which is removed is determined by a combination of the reaction rate of the reactant film with the material of the layer to be etched and "y" the diffusion rate of reactant through the solid layer. Since a solid layer of products is formed, it is necessary to heat the substrate after termination of the reaction in order to remove the reacted layer.

Figure 9:
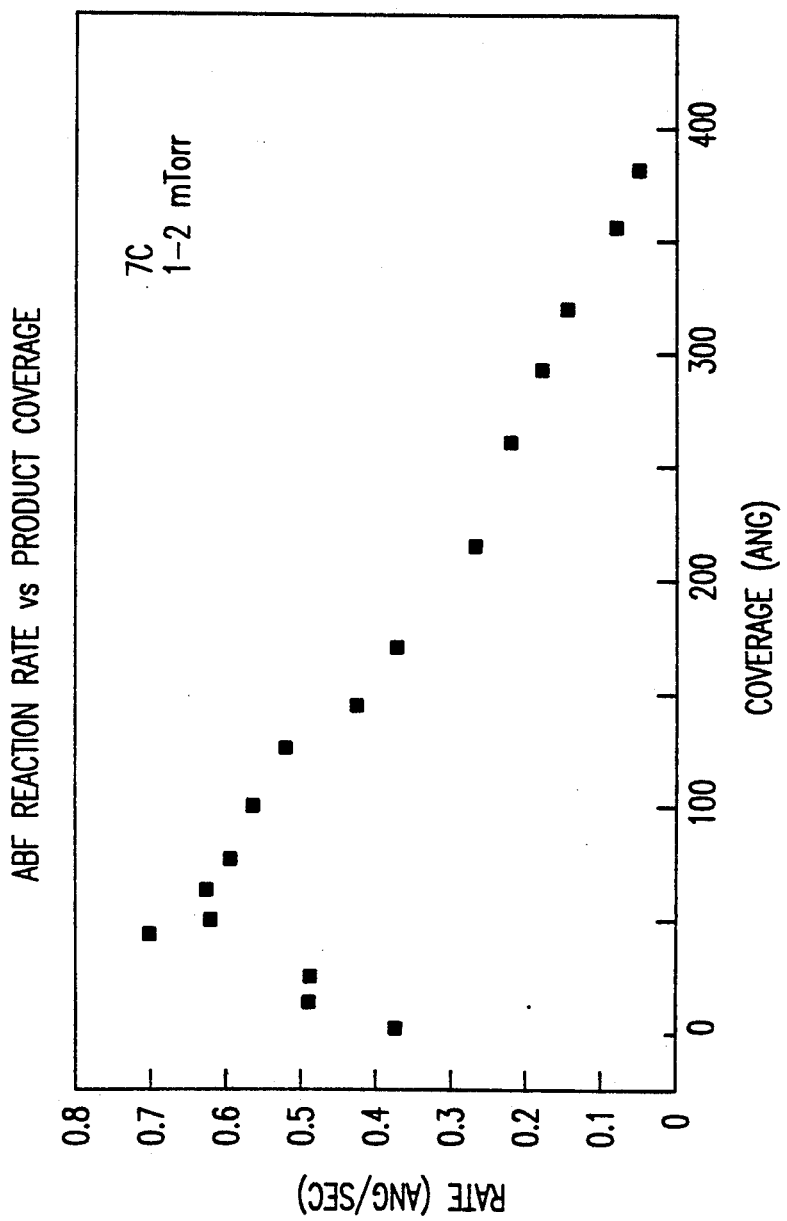
FIG. 9 shows the rate of product formation as a function of the thickness of product when sputter silicon dioxide is exposed to vapors above a cell of ammonium bifluoride.
Figure 10:
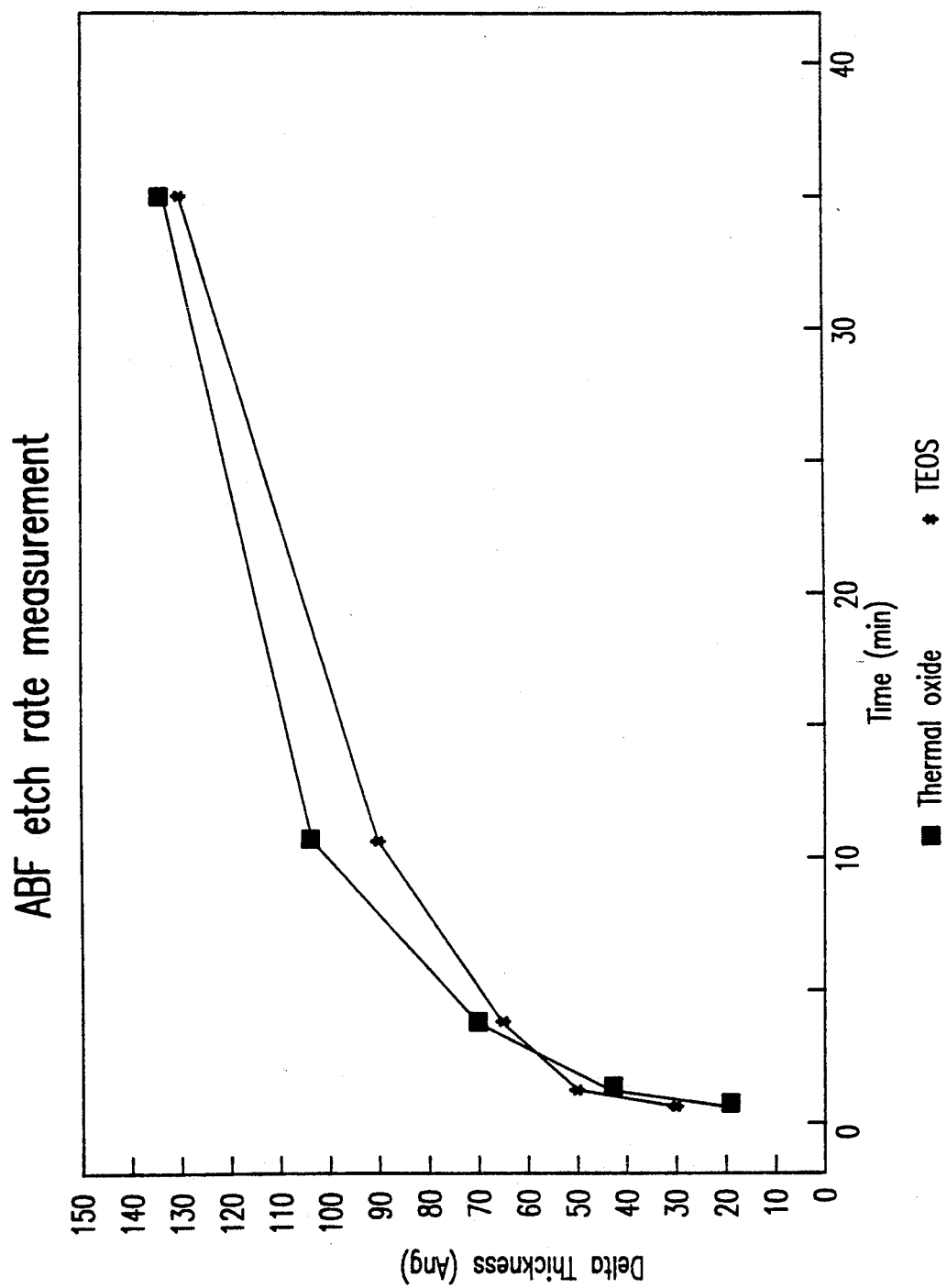
FIG. 10 compares the etch rate on TEOS oxide and thermal silicon dioxide following exposure to vapors above a cell of ammonium bifluoride as a function of exposure time.

Presence of a reacted layer on the surface improves control over the reaction of HF with the $SiO_2$ layer. HF must pass through the reacted layer to reach unreacted $SiO_2$. FIG. 9 shows that the rate of reaction of HF with $SiO_2$ declines with time as the thickness of the reacted layer increases. At long exposure times, the rate of diffusion of HF through the reacted layer approaches zero, and the reaction is essentially terminated. Therefore, the amount of oxide removed is controlled more by the inherent ability of HF to diffuse through the reacted layer than by the reactivity of the oxide surface. FIG. 10 compares TEOS and thermal oxide etching with both the silicon dioxide surfaces and the ammonium bifluoride source of reactant at 25° C. It is clear that at shorter times more TEOS oxide than thermal oxide reacts, because the reaction rate is controlled by the inherent reactivity of the oxide rather than by diffusion. After about 70 Angstroms is reacted, the amounts reacted are similar because the rate of diffusion of reactant through the product layer begins to dominate. It is not necessary to wait for the self-limiting thickness in order to etch similar amounts of different types of oxide.

The thickness required for diffusion of reactant to limit the reaction rate can be controlled by changing the temperature of the reaction. The self-limiting thickness can be controlled by changing the temperature of the reaction. When the temperature is lower, the diffusion rates are lower and the self-limiting reaction thickness is thinner. The evidence for this behavior is that exposure to many thousands of layers of condensed vapors from ammonium bifluoride for many minutes removes only a few tens of angstroms of silicon dioxide when the temperature is −35° C.

Alternatively, the amount of silicon dioxide which is etched can be controlled by changing the ratio of HF to $NH_3$ in the gas above the silicon dioxide surface. Pure HF etches silicon dioxide with no self-limiting process. Ammonia is necessary to form the hexafluorosilicate product. Etch thicknesses between the infinite thickness of pure HF and the thicknesses obtained with ammonium bifluoride ($HF:NH_3=2$) can be obtained by varying the HF to $NH_3$ ratio in the gas above the oxide surface.

Figure 1:
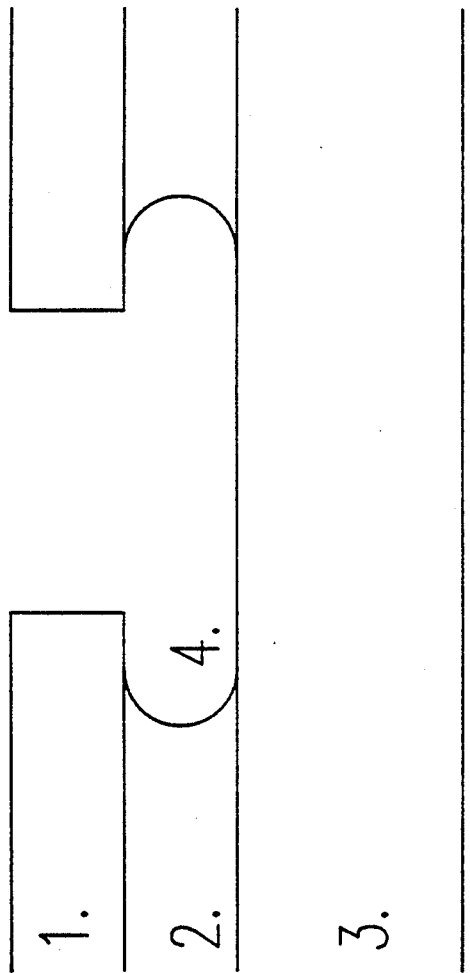
FIG. 1 is a cross-sectional side view of a prior art semiconductor wafer following uncontrolled isotropic etching of one layer.
Figure 2A:
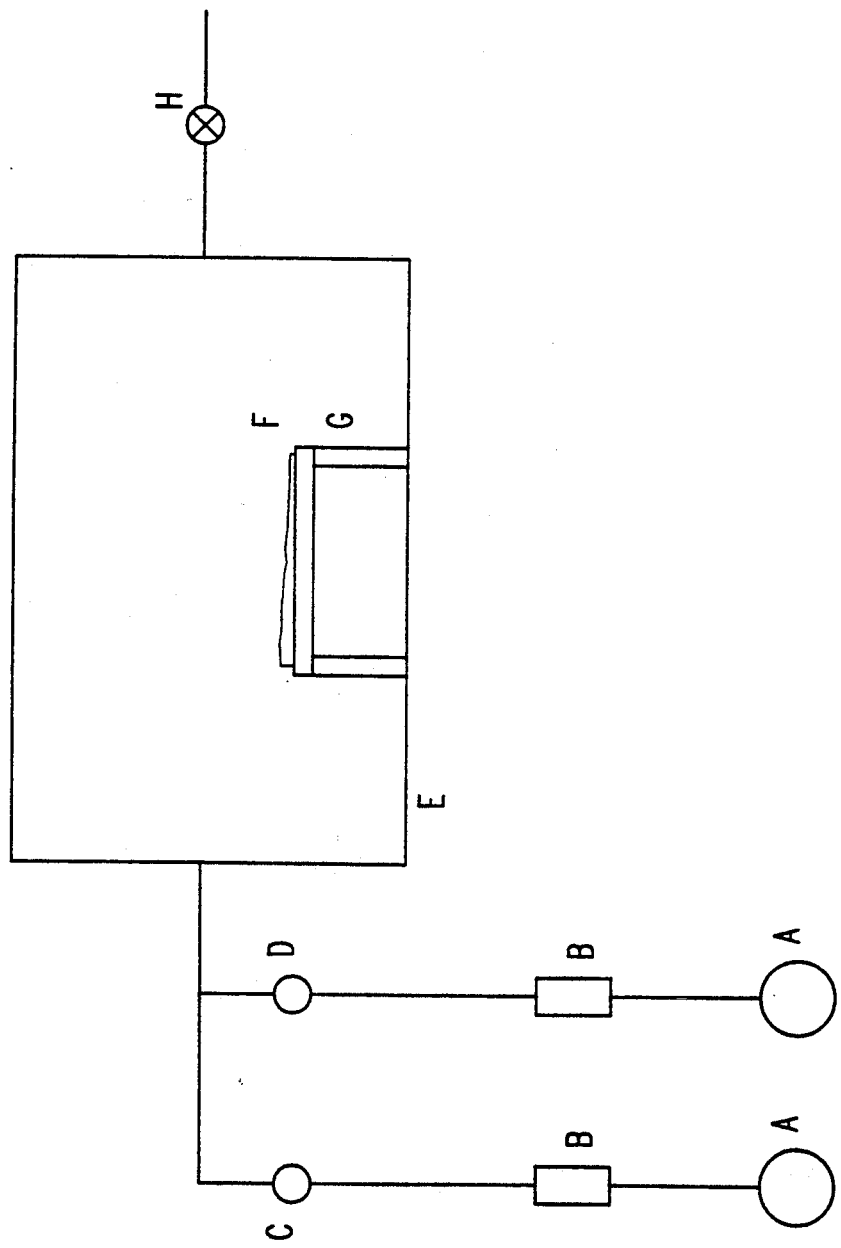
FIG. 2a is a cross-sectional side view of prior art equipment for etching a thin layer. The apparatus uses a source of gaseous reactant which incorporates flow meters.
Figure 2B:
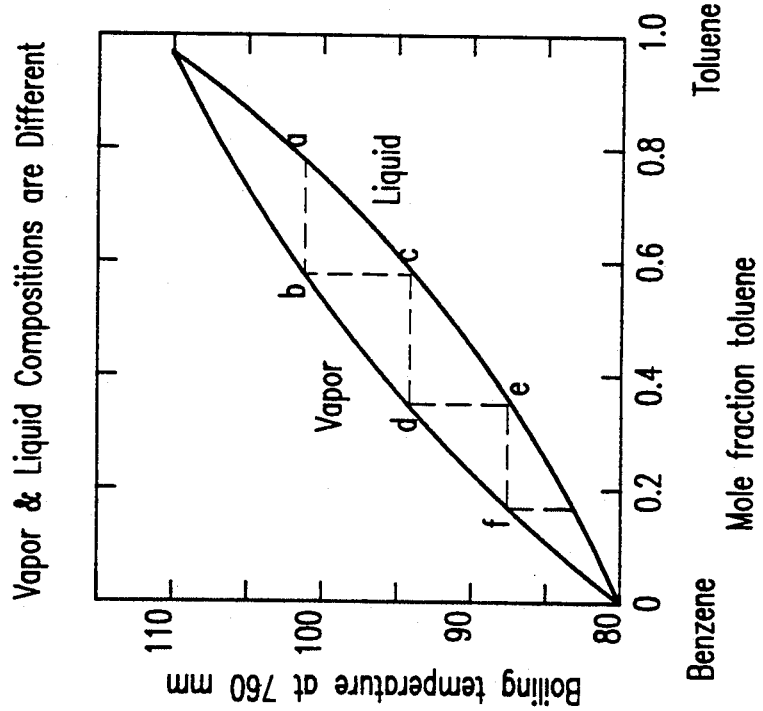
FIG. 2b shows the equilibrium composition of a two component liquid mixture and the vapor pressure above the mixture.

An especially preferred way to minimize the type of undercut shown in FIG. 1 is to use product layer control. Furthermore, the self-limiting thickness can be tailored to match the thickness of layer 2.

Characterization of the Reacted Layer

The reaction of HF with silicon dioxide when in contact with condensed ammonium bifluoride is similar to the reaction in aqueous solution, i.e., $SiO_2+4HF=SiF_4+2H_2O$. However, instead of being released to the solution, the $SiF_4$ product is trapped and reacts within the condensed film to produce ammonium hexafluorosilicate, $(NH_4)_2SiF_6$. The ammonium hexafluorosilicate is observed in IR spectra of reacted layers. Microbalance results also show the presence of the reacted layer. Condensation of ammonia and HF followed by desorption of the unreacted excess produces a frequency decline of 101 Hz, corresponding to reaction of 84 Å of the several thousand angstrom thick layer of ammonia and HF that initially condensed. The minimum frequency near the 2000 second point in FIG. 5 corresponds to an initial layer of 8700 Å. After heating to 100° C. there is a 103 Hz increase of resonant frequency corresponding to removal of 58 Å of silicon dioxide.

Figure 6:
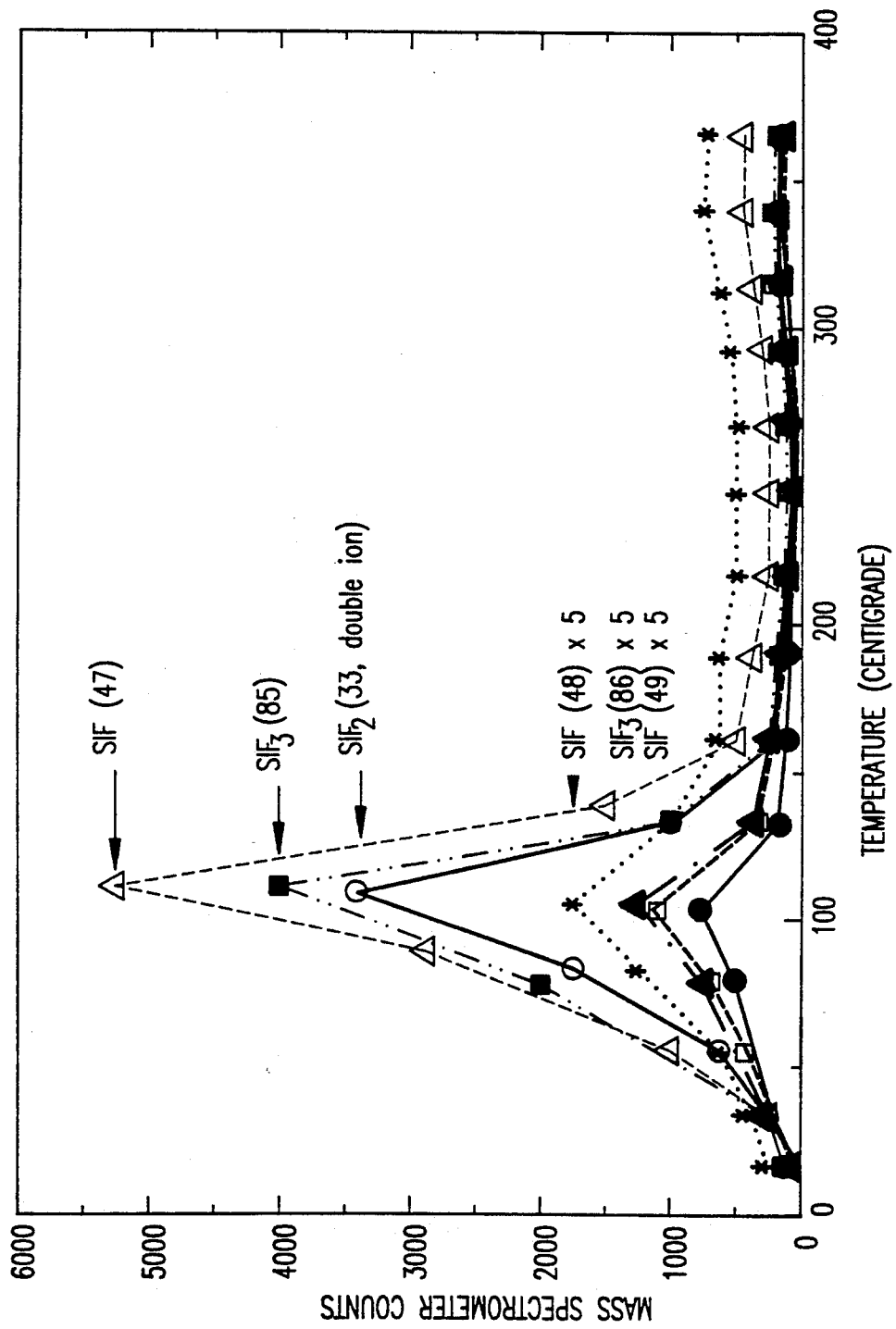
FIG. 6 is a thermal desorption spectrum showing the mass of gas phase molecules from a layer of reaction products which desorbs into the gas phase near 100° C.

Thermal desorption spectra of silicon containing molecules of reaction product are shown in FIG. 6. The identical time dependence of peaks at masses 47, 85, 33, 48, 86, 49, and 87 indicates simultaneous release from the reacted layer and are the masses expected from and $SiF_4$ parent. Masses 85, 86, and 87 come from $SiF_{3+}$ containing the mass 28, 29, and 30 silicon isotopes, masses 47, 48, and 49 are from $SiF^+$ and mass 33 is $SiF_2^{++}$. These thermal desorption spectra are consistent with $SiF_4$ released upon thermal decomposition of the reacted layer of ammonium hexafluorosilicate. Starting from an unreacted $SiO_2$ layer, the decline in the microbalance frequency from a reacted layer consisting entirely of ammonium hexafluorosilicate is two times the frequency increase from removal of $SiO_2$. The product layer can also be removed by rinsing in a solvent, such as water.

ADVANTAGEOUS ASPECTS OF THE INVENTION

Aspects Relating to Pressures

Some applications require carrying out the etching process in a chamber at low pressure ($10^{-3}$ Torr to $10^{-10}$ Torr), or in a chamber attached to one operating at low pressure. A differentially pumped source of reactant besides enabling the low pressure operation described herein supra, provides the following advantages: delivery of reactant is directional for minimization of undercut, or for penetration of high aspect ratio structures on the wafer, and there is simple control of the amount of reactant deposited on the substrate and, therefore, the amount of the etched layer which is removed. Since the flux of reactant leaving this type of source and striking the surface of the wafer to be etched is constant in time, and is not strongly affected by collisions between gas molecules in the reaction chamber, the amount deposited is easily controlled by an accurately timed opening of a shutter 59 shown in FIG. 3, or a valve which could replace the shutter. The source can be the effusive source described in a section, supra, setting forth the low pressure operation, a supersonic molecular beam source, or any other source operating with few collisions between the source and the wafer.

Aspects Relating to Temperatures

There are a number of different temperature regimes with differing modes of operation. Some important aspects which relate to temperatures of the substrate, chamber, and the source are now set forth.

Since the vapor pressure of a reactant increases with temperature, the low pressure operation described above requires a relatively low substrate temperature. In the example described using ammonia and HF or ammonium bifluoride, the temperature must be lowered to facilitate condensation of reactant, then raised to facilitate evaporation of the reaction products. Operation at a constant temperature is not possible. Both substrate cooling and substrate heating are required, although a heating coil is shown in the Figures (heater 55 in FIG. 3 for example), any form of heating is possible, with greatest benefit from a rapid mode of heating. Time scales for heating could range all the way from less than a few nanoseconds if light from a laser is used, all the way to many seconds if a more conventional approach is used. Some possibilities for heaters include, pulsed light from a laser or lamp, a resistive heater, an induction heater, or an electron or ion beam heater and the like.

Another desirable mode of operation would be the one that does not require cycling of the temperature. In the case of oxide removal using gaseous HF and $NH_3$, the temperature would have to be fixed at a value above that required for desorption of reaction product. FIG. 6 shows the best temperature value to be in a range between 50°–150° C. A controlled amount of ammonia and HF is then admitted at a pressure above the equilibrium pressure found above solid ammonium fluoride or ammonium bifluoride at the chosen temperature value so that there is condensation or adsorption upon the surface to be etched. Although 50°–100° C. is not far above room temperature for silicon dioxide removal with condensed ammonia and HF, there may be cases where temperatures far above room temperature may be desirable. For instance, it may be advantageous to have the reactant source, the substrate to be etched, and the chamber, all at a temperature substantially higher than the room temperature when the reactant or reaction products are not very volatile. When the wafer is below −35° C. to −40° C., molecules in the vapor from an ammonium bifluoride cell stick to the wafer where they strike the wafer. The vapor pressure is below $-10^{-8}$ Torr so that re-evaporation is negligible and the sticking coefficient is high. Other reactants less volatile will stick where they hit when the wafer is at a higher temperature than −35° C. More volatile reactants would require a lower wafer temperature.

Aspects Relating to Chemistry

Although the reactions discussed herein are designed to remove oxide from silicon, other combinations are possible. For instance, a number of different chemistries commonly used with aqueous solutions could be employed in the devices of the present invention designed for accurate etching.

Some of the specific sources include the gaseous vapor from solid ammonium bifluoride; a solution of HF, $NH_3$, and $H_2O$; separate sources of HF, $NH_3$, and $H_2O$; separate sources of HF and $NH_3$; a solution of $NH_3/H_2O$ coupled with a gaseous or solution source of HF, and the like. Solvents or solutions other than water could be used; for instance water could be replaced by alcohol. HF-based chemistries can be used to remove oxide from other substrates besides silicon. For instance, the silicon dioxide which forms on many silicides could react with condensed layers containing HF. Other oxides besides silicon dioxide will react with condensed layers containing HF and $NH_3$ or $H_2O$. For instance, experiments show HF vapor chemistries, including the vapor from ammonium bifluoride solid, can remove oxides which incorporate germanium. Even pure germanium oxide will react.

It may be noted that there are a number of low pressure, or high temperature chemistries which use a source of a solid containing ammonium ions or separate sources containing ammonia and an acid. Ammonia seems to be rather unique in that ammonia has a high vapor pressure and yet the ammonium ion containing solid which forms upon reaction with an acid is not particularly volatile. Thus, there could be a number of aqueous chemistries which etch films besides oxides to show analogous reactions in condensed films containing ammonia. When etching material, it is not necessary to etch a large amount of the material. For instance, removal of trace metal contamination may be achieved by the apparatus and method of this invention.

Although preferred embodiments use stable molecules, the reactant supply means can be a discharge source which synthesizes reactant from precursor in the source or in the chamber.

While the invention has been described in terms of preferred embodiments, those skilled in the art will recognize that the invention can be practiced with modification within the spirit and scope of the appended claims. For instance, the apparatus and method can be used to prepare the chemical composition and structure of a single layer or partial layer on the surface of a substrate. To wit, removal of oxide from silicon with vapor from ammonium bifluoride leaves a surface layer containing Si-F. Sequential application of vapor from ammonium bifluoride followed by $H_2O$ would remove the Si-F and replace it with other chemical species.

It may be noted that although the preferred embodiments show a single wafer in the reaction chamber, it will be easily suggested to the skilled artisan to perform the invention simultaneously on multiple wafers within the reaction chamber.

Having thus described our invention, what we claim as new and desire to secure by Letters Patent is as follows:

1. An etching apparatus comprising the following components:
   a chamber;
   means for supply of reactant to said chamber;
   means for supporting a substrate within said chamber, said substrate having a material thereon able to be etched by said reactant;
   means for forming a film comprising said reactant on the surface of said material;
   means for controlling the nature and duration of said film;
   wherein the components are so arranged that when said reactant is supplied to said chamber, said reactant forms a film on the surface of said material, the nature and duration of said film being so controlled by said controlling means that said film leads to the removal of an accurately controlled amount of said material on said substrate.

2. The apparatus as defined in claim 1, wherein said film is a condensed or absorbed layer of the reactant molecules.

3. The apparatus as defined in claim 2, wherein said means for controlling said condensed film comprises a cooling means to ensure that the coldest point in the chamber is the substrate.

4. The apparatus as defined in claim 2, wherein said means for controlling said condensed film comprises a heating means attached to the peripheral walls of said chamber so that the temperature of said walls is higher than that of any condensed material in the chamber.

5. The apparatus as defined in claim 2, wherein said means for controlling said condensed film comprises a reservoir with a valve disposed between said means for supply of reactant and said chamber, so that an accurate amount of said reactant can be rapidly admitted to said chamber from said reservoir when said valve is rapidly opened.

6. The apparatus as defined in claim 2, further including a pump connected to said chamber.

7. The apparatus as defined in claim 6, wherein said means for controlling said condensed film comprises means for delivering an accurate amount of said reactant to said chamber, and a valve disposed between said chamber and said pump, so that when said valve is closed, the reactant remains in said chamber until substantially reacted with said material.

8. The apparatus as defined in claim 6, wherein said means for controlling said condensed film comprises means for differential pumping disposed between said means for supply of reactant and said chamber, and a pump connected to said means for differential pumping, so that molecules from said source of the reactant travel substantially without collision while in transit through said chamber to said substrate yielding a composition and flux that are constant in time.

9. The apparatus as defined in claim 2, wherein said means for controlling said condensed film comprises a computer and a program means enabling said computer to carry out predetermined operations.

10. The apparatus as defined in claim 2, wherein said reactant comprises a single or a plurality of gaseous molecules.

11. The apparatus as defined in claim 2, wherein said means for controlling said condensed film comprises a heating means attached to said means for supporting said substrate.

12. The apparatus as defined in claim 2, wherein said reactant comprises molecules of HF, $H_2O$, $NH_3$, ammonium bifluoride or a combination thereof.

13. The apparatus as defined in claim 10 wherein said reactant comprises a mixture of HF and $NH_3$.

14. The apparatus of claim 12, wherein the source of said HF molecules is distinct from the source of said $H_2O$ molecules which is distinct from the source of said $NH_3$ molecules.

15. The apparatus of claim 14, wherein the source of supply of $H_2O$ is $H_2O$ molecules desorbed from the walls of said chamber.

16. The apparatus as defined in claim 12, wherein the source of said molecules is a solution of $NH_3$, HF, or $H_2O$.

17. The apparatus as defined in claim 12, wherein said reactant is ammonium bifluoride which is supplied in a gaseous phase.

18. The apparatus of claim 12, wherein said reactant is a mixture of HF and $H_2O$.

19. The apparatus of claim 12, wherein said reactant is a mixture of ammonium bifluoride and HF.

20. A method for etching, comprising the steps of:
 (a) supporting, in a vacuum chamber, a substrate having a material to be etched;
 (b) admitting reactant containing gas into said chamber at a sufficient pressure so as to form a film of the reactant on the surface of said material;
 (c) controlling the composition and residence time of said film on the surface of said material so as to etch an accurate amount of material on said substrate; and
 (d) removing any unwanted reactant and reaction products from the chamber or surface of said substrate.

21. The method of claim 20, wherein said film is a condensed or adsorbed layer of reactant molecules, and controlling the residence time and composition of said condensed or adsorbed film comprises maintaining the temperature of said substrate below the temperature of any other surface in the chamber so as to substantially eliminate condensation of said reactant on any of said surface.

22. The method of claim 21, wherein controlling the residence time and the composition of said condensed film comprises admitting said reactant at a high enough rate so as to minimize uncertainty in the onset time for condensation of said reactant.

23. The method of claim 20, wherein controlling said residence time and composition of said condensed film comprises using a microbalance to detect the presence of the reactant film.

24. The method as defined in claim 20, wherein said controlling comprises admitting an accurate amount of said reactant into said chamber which is connected to a pump through a closed valve until said reactant in said chamber has sufficiently reacted with the material to be etched, whereupon the valve is opened.

25. The method of claim 21, wherein controlling comprises employing an effusion cell or low pressure and cooling the substrate.

26. The method of claim 21, controlling comprises employing differentially pumped source and maintaining chamber pressure below 10-4 Torr.

27. The method as defined in claim 21, wherein controlling comprises maintaining the substrate temperature below solidification temperature of either product or condensed film so that etching is determined by a combination of diffusion through the solidified film and the reaction rate at the substrate temperature and where etching occurs without falling away of the product at a thickness below the self-limiting thickness.

28. The method of claim 21, wherein controlling comprises waiting for sufficient time to allow diffusion of reactant so that the same amount of material is etched.

29. The method of claim 21, utilizing $NH_3$ and HF as reactant at a temperature less than 50° C. during dosing with temperature cycling.

30. The method of claim 21, employing $NH_3$ and HF on $SiO_2$ substrate at a temperature greater than 50° C. so that there is no temperature cycling.

31. The method of claim 21, wherein the material to be etched is silicon dioxide.

32. The method of claim 21, wherein the material to be etched is germanium oxide using HF as a reactant.

33. The method of claim 21, wherein the reactant forms a combination of $NH_3$ and HF, each admitted separately into the chamber.

34. The method of claim 21, wherein the reactant forms a surface layer on the material to be etched, the reactant being selected from the group consisting of HF, $H_2O$, $NH_3$, ammonium bifluoride and a combination thereof.

35. The method of claim 34, wherein each of said reactant is admitted separately into the chamber under specific temperature and pressure conditions.

36. The apparatus of claim 1, wherein said means for controlling said film is a quartz crystal microbalance or an ellipsometer.

37. The apparatus of claim 1, wherein means for supply of said reactant is an unheated solid source of HF, including ammonium bifluoride or ammonium fluoride.

38. The method of claim 34, using a condensed source of HF, including ammonium bifluoride, ammonium fluoride or aqueous solution of HF whose temperature is less than or equal to the temperature of the substrate, where reaction chamber is pumped out, the source is opened and the chamber is isolated from the pump by closing a shutoff valve so that the pressure within the chamber rises rapidly to a termination pressure, then after the reaction is substantially complete, the source is closed and the chamber is pumped out.

39. The method of claim 34, using a condensed source without added inert gas, assuring that there is a flow of the reactant, with optional heating and pumping the chamber so that the pressure within the chamber is maintained at termination pressure, or within a factor of 10 of termination pressure by adjusting the pumping speed, source temperature, or flow rate of reactant into the chamber.

40. The method of claim 34, using a source comprising HF & $NH_3$ and forming a condensed product layer to control the amount of material to be etched, while the reaction approaches self-limiting thickness controlled by adjusting the temperature, pressure and gaseous composition in the chamber.

41. The method of claim 34, wherein the reactant comprises HF and ammonia, and optionally $H_2O$, so that a condensed product layer of self-terminating thickness is formed and etching occurs without falling away of the product at thicknesses below the self-limiting thickness.

42. The method according to claim 41 of etching two layers of oxides exposed simultaneously to the reactant.

43. The method of claim 41, wherein the rate of etching is controlled by diffusion of the reactant into the product layer.

44. The method of claim 40, wherein said reactant is condensed HF or a HF/$H_2O$ solution in a container having a shutoff valve disposed between said container and a vacuum pump connected to the chamber.

45. The method of claim 40, wherein the temperature of the substrate or wafer is above 50° C. so that the product desorbs without temperature cycling.

46. The apparatus of claim 41, wherein a thickness of said film limits further diffusion of reactant to the material to be etched.

47. The method of claim 20, wherein controlling the residence time and composition of said film comprises pumping out reaction chamber maintaining a condensed source at a temperature less than or equal to the temperature of the substrate, the source is opened and the chamber is isolated from the pump by closing a shut-off valve so that the pressure within the chamber rises rapidly to a termination pressure, then closing the chamber after the desired degree of reaction has taken place.

48. The method of claim 20, wherein a condensed source is used without added inert gas assuring that there is a flow of the reactant with optional heating and pumping the chamber, so that the pressure entering the chamber is maintained at termination pressure or within a factor of 10 of termination pressure by adjusting the pumping speed, source temperature, or flow rate of reactant into the chamber.

* * * * *